United States Patent
Leeser et al.

(10) Patent No.: US 9,315,899 B2
(45) Date of Patent: Apr. 19, 2016

(54) CONTOURED SHOWERHEAD FOR IMPROVED PLASMA SHAPING AND CONTROL

(75) Inventors: Karl F. Leeser, West Linn, OR (US); James S. Sims, Tigard, OR (US)

(73) Assignee: Novellus Systems, Inc., Fremont, CA (US)

( * ) Notice: Subject to any disclaimer, the term of this patent is extended or adjusted under 35 U.S.C. 154(b) by 960 days.

(21) Appl. No.: 13/541,595

(22) Filed: Jul. 3, 2012

(65) Prior Publication Data
US 2013/0334344 A1 Dec. 19, 2013

Related U.S. Application Data

(60) Provisional application No. 61/660,617, filed on Jun. 15, 2012.

(51) Int. Cl.
*B05B 17/00* (2006.01)
*C23C 16/509* (2006.01)
(Continued)

(52) U.S. Cl.
CPC ............... *C23C 16/509* (2013.01); *B05B 1/00* (2013.01); *B05B 1/14* (2013.01); *B05B 12/00* (2013.01); *C23C 16/4412* (2013.01); *C23C 16/45565* (2013.01); *G05B 19/41* (2013.01); *H01J 37/3244* (2013.01); *H01J 37/32082* (2013.01);
(Continued)

(58) Field of Classification Search
CPC ............ B05B 1/00; B05B 12/00; B05B 1/14; H01J 37/3244; H01J 37/32082; H01J 37/32541; H01J 37/32568; H01J 37/32091; H01J 37/32449; C23C 16/4412; C23C 16/509; C23C 16/45565; G05B 19/41; H01L 21/02274

USPC ................ 239/1, 67, 69, 548, 558, 596, 590; 438/758; 700/187; 118/715; 427/569; 156/345.33, 345.34
See application file for complete search history.

(56) References Cited

U.S. PATENT DOCUMENTS 5,500,256 A 3/1996 Watabe
6,287,981 B1 9/2001 Kim et al.
(Continued)

FOREIGN PATENT DOCUMENTS

CN ZL201130106174.3 4/2011
EP 001264840-0001 3/2011
(Continued)

OTHER PUBLICATIONS

U.S. Office Action dated Oct. 29, 2013 issued in U.S. Appl. No. 12/916,269.
(Continued)

*Primary Examiner* — Steven J Ganey
(74) *Attorney, Agent, or Firm* — Weaver Austin Villeneuve & Sampson, LLP

(57) ABSTRACT

Semiconductor processing chamber showerheads with contoured faceplates, as well as techniques for producing such faceplates, are provided. Data describing deposition rate as a function of gap distance between a reference showerhead faceplate and a reference substrate may be obtained, as well as data describing deposition rate as a function of location on the substrate when the reference showerhead and the reference substrate are in a fixed arrangement with respect to each other. The two data sets may be used to determine offsets from a reference plane associated with the faceplate that determine a contour profile to be used with the faceplate.

20 Claims, 23 Drawing Sheets

(51) Int. Cl.
  *B05B 1/14* (2006.01)
  *B05B 12/00* (2006.01)
  *B05B 1/00* (2006.01)
  *H01J 37/32* (2006.01)
  *H01L 21/02* (2006.01)
  *G05B 19/41* (2006.01)
  *C23C 16/44* (2006.01)
  *C23C 16/455* (2006.01)

(52) U.S. Cl.
  CPC ..... *H01J 37/32091* (2013.01); *H01J 37/32449* (2013.01); *H01J 37/32541* (2013.01); *H01J 37/32568* (2013.01); *H01L 21/02274* (2013.01)

(56) References Cited

U.S. PATENT DOCUMENTS

| | | | |
|---|---|---|---|
| D459,434 S | 6/2002 | Fauquet | |
| D459,435 S | 6/2002 | Fauquet | |
| 6,435,428 B2* | 8/2002 | Kim | C23C 16/452 239/590 |
| D466,183 S | 11/2002 | Tse | |
| 6,761,796 B2 | 7/2004 | Srivastava et al. | |
| D495,776 S | 9/2004 | Blomstrom | |
| 6,983,892 B2* | 1/2006 | Noorbakhsh | C23C 16/45565 239/596 |
| 6,983,898 B2 | 1/2006 | Clark | |
| 7,273,526 B2* | 9/2007 | Shinriki | C23C 16/34 118/715 |
| D593,640 S | 6/2009 | Schoenherr et al. | |
| D599,881 S | 9/2009 | Wang et al. | |
| 7,601,223 B2* | 10/2009 | Lindfors | C23C 16/4412 118/715 |
| 7,658,800 B2* | 2/2010 | Chen | C23C 16/45565 118/715 |
| D619,202 S | 7/2010 | Zhang | |
| D623,721 S | 9/2010 | Reynoso | |
| D624,155 S | 9/2010 | Yokoyama et al. | |
| D641,829 S | 7/2011 | Angelov et al. | |
| 2004/0216665 A1 | 11/2004 | Soininen et al. | |
| 2005/0183666 A1 | 8/2005 | Tsuji et al. | |
| 2007/0006893 A1 | 1/2007 | Ji | |
| 2007/0095284 A1 | 5/2007 | Iizuka et al. | |
| 2007/0259130 A1 | 11/2007 | Von Kaenel et al. | |
| 2008/0081474 A1 | 4/2008 | Suzuki | |
| 2008/0190760 A1 | 8/2008 | Tang et al. | |
| 2008/0248656 A1 | 10/2008 | Chen et al. | |
| 2008/0299326 A1 | 12/2008 | Fukazawa et al. | |
| 2009/0206055 A1 | 8/2009 | Sato et al. | |
| 2012/0094503 A1 | 4/2012 | Shanker et al. | |
| 2012/0108072 A1 | 5/2012 | Angelov et al. | |

FOREIGN PATENT DOCUMENTS

| | | |
|---|---|---|
| JP | 1433951 | 1/2012 |
| SG | D2011/530 Z | 4/2011 |

OTHER PUBLICATIONS

U.S. Final Office Action dated Mar. 14, 2014 issued in U.S. Appl. No. 12/916,269.

KR Notice of Amendment Rejection dated Nov. 2, 2012 issued in KR Design Application No. 30-2011-0009829.

KR Notice of Provisional Rejection dated Jul. 27, 2012 issued in KR Design Application No. 30-2011-0009829.

KR Refusal to Grant dated Dec. 21, 2012 issued in KR Design Application No. 30-2011-0009829.

U.S. Notice of Allowance issued in U.S. Appl. No. 29/378,161 dated Mar. 28, 2011.

Office Action issued in Taiwanese Application No. 100301797 dated Nov. 29, 2011.

Notice of Allowance issued in Taiwanese Application No. 100301797 dated Mar. 23, 2012.

Notice of Allowance issued in Japanese Application No. 2011-008763 dated Dec. 13, 2011.

Notification of Grant issued in Chinese Application No. 201130106174.3 dated Sep. 28, 2011.

Chapter 3 of A. J. van Roosmalen, J.A.G. Baggerman and S.J.H. Brader, Dry Etching for VLSI, Springer (Mar. 31, 1991).

Technical drawing of Novellus Systems, Inc., "ANODE, 300MM, Extreme Cell", production release date of Mar. 27, 2007.

* cited by examiner

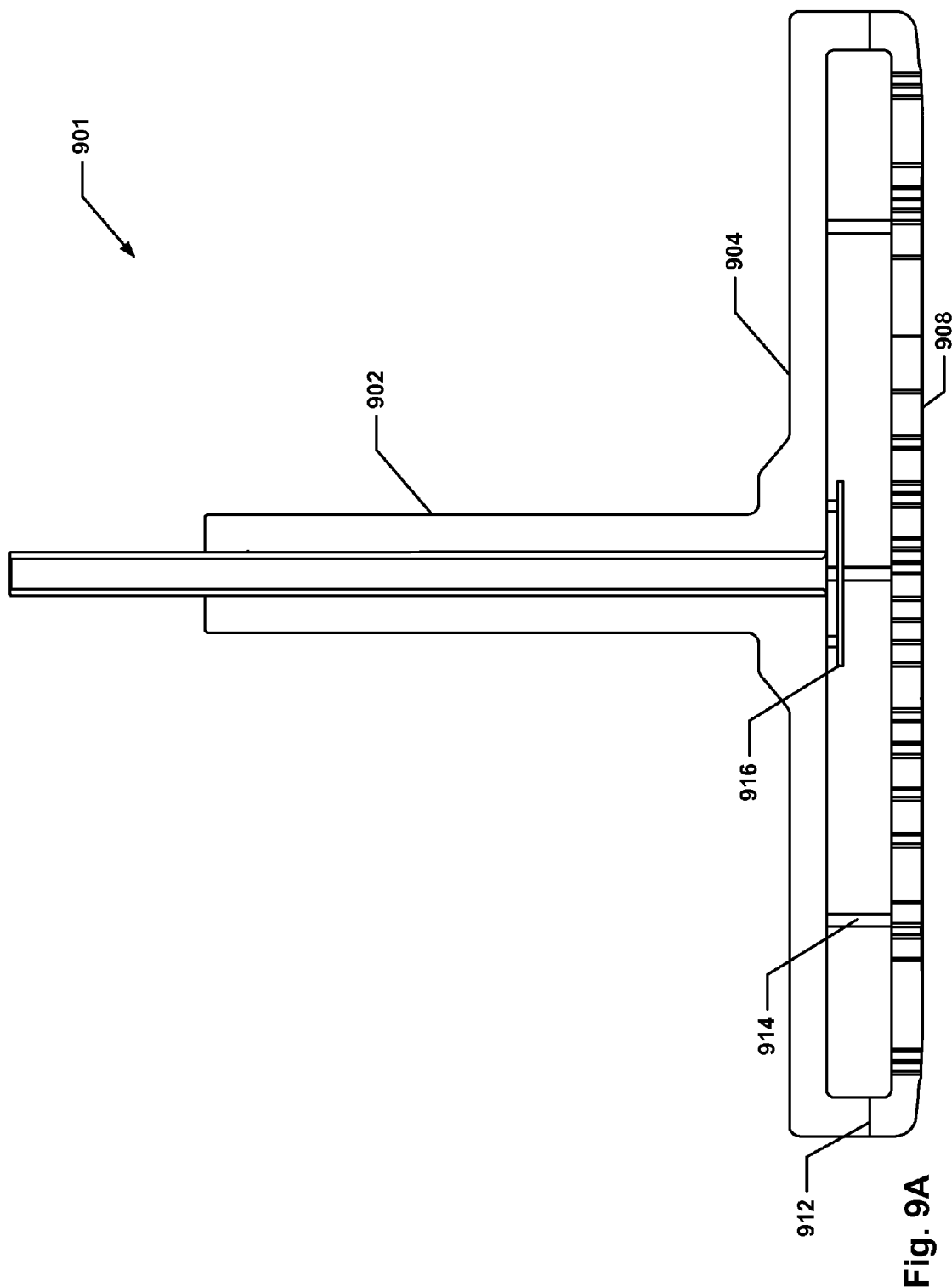

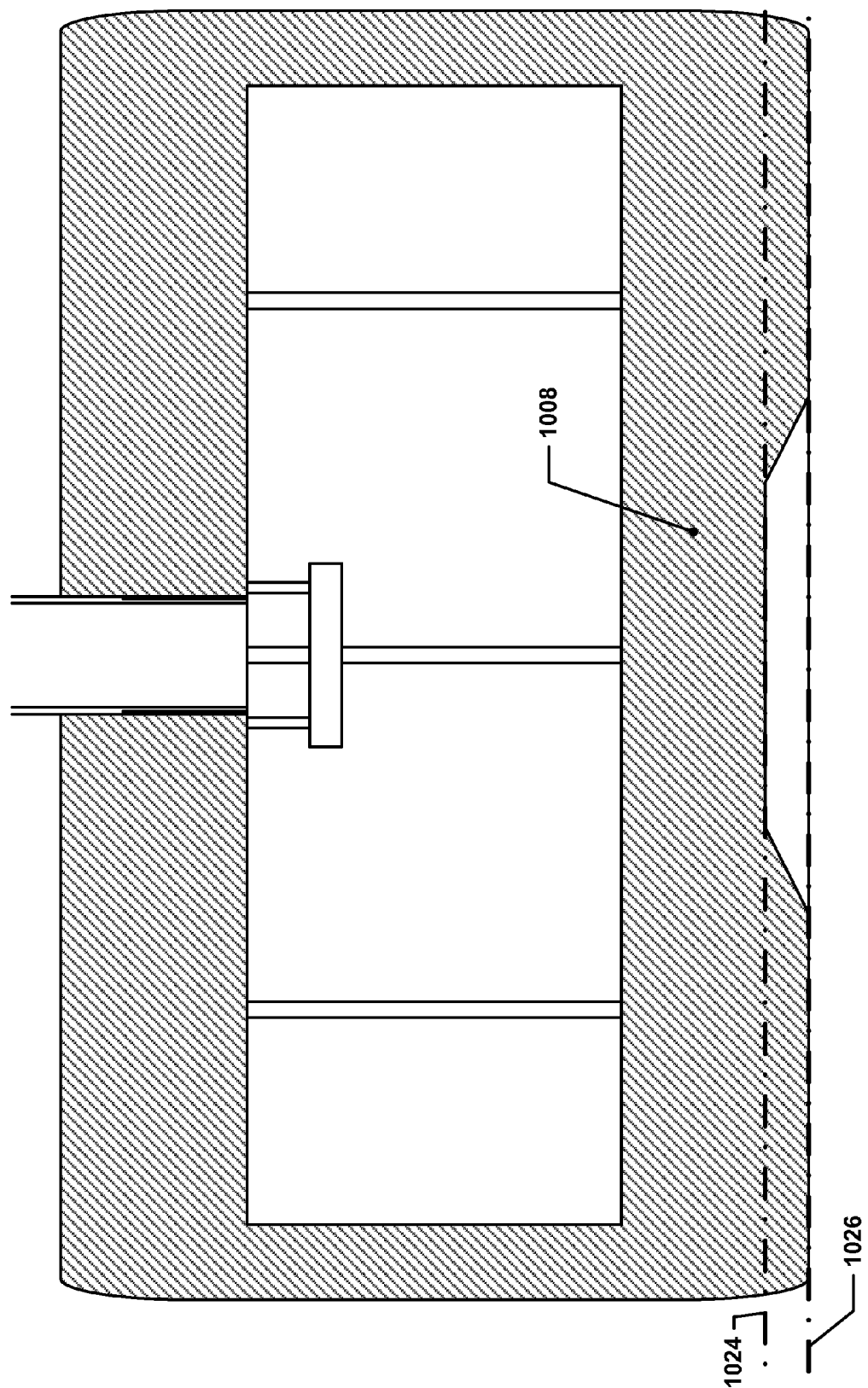

CONTOURED SHOWERHEAD FOR IMPROVED PLASMA SHAPING AND CONTROL

CROSS-REFERENCE TO RELATED APPLICATIONS

This application claims benefit under 35 U.S.C. §119(e) to U.S. Provisional Application No. 61/660,617, filed Jun. 15, 2012, which is incorporated by reference herein in its entirety.

BACKGROUND OF THE INVENTION

Semiconductor processing tools often use components called "showerheads" to distribute process gases, e.g., reactants, across a semiconductor substrate during processing. Showerheads are often sized to be larger than the substrates with which they are designed to be used, and may also serve as an RF electrode for the purposes of capacitively-coupled plasma generation. A typical showerhead may include a faceplate that forms one wall of a plenum; the faceplate may generally be oriented to be parallel to, and facing, a substrate being processed using the showerhead. The faceplate may have a large number of through-holes distributed across it, and gases introduced into the plenum may flow through the through-holes and towards substrates being processed using the showerhead.

SUMMARY OF THE INVENTION

Various implementations discussed in this disclosure may be used to provide contoured showerhead faceplates for use in a plasma processing environment, e.g., a capacitively-coupled plasma (CCP) system and process. In a CCP system or process, a semiconductor substrate may be supported on a substrate support underneath a showerhead apparatus that delivers process gas across the semiconductor substrate. An electric field may be generated between the wafer and the showerhead, thereby ionizing the process gas and forming a plasma. The electric field may be generated between two electrodes, e.g., the substrate support and the showerhead. The resulting plasma sheath may be used to process the semiconductor substrate. Variations in plasma sheath density may result in non-uniformities in the semiconductor process. At present, efforts in the industry are largely directed at attempting to mitigate such non-uniformities by, for example, changing the densities or arrangements of gas distribution holes across the showerhead faceplate to alter the distribution of the gas that is used to form the plasma. The present disclosure, however, is directed at a fundamentally different approach.

In some implementations, a method for producing a showerhead faceplate for use in semiconductor manufacturing processes is provided. In one implementation, the method may include obtaining first deposition rate data describing first deposition rates, each first deposition rate correlated with a gap distance between a reference showerhead faceplate and a reference substrate during performance of a semiconductor manufacturing process involving a capacitively-coupled plasma, wherein the gap distances correlated with at least two of the first deposition rates are different. The method may also include obtaining second deposition rate data, the second deposition rate data describing second deposition rates when the reference showerhead faceplate is in a fixed configuration with respect to the reference substrate during the semiconductor manufacturing process involving the capacitively-coupled plasma, the second deposition rates associated with locations distributed across one or more portions of the reference showerhead faceplate during performance of the semiconductor manufacturing process. The method may also include determining a contour profile for a contoured showerhead faceplate based on the first deposition rate data and the second deposition rate data.

In some implementations of the method, the second deposition rate data may be deposition layer thickness at the locations. In some implementations, determining the contour profile may include determining a nominal deposition rate and determining a reference plane for the contoured showerhead faceplate. The reference plane may be defined, when the contoured showerhead faceplate is used during the semiconductor manufacturing process, to be substantially parallel to substrates being processed in the semiconductor manufacturing process, and offset from the substrates by the gap distance correlated with the first deposition rate corresponding to the nominal deposition rate. The determining of the contour profile may also include determining a gap distance delta for each of the locations by subtracting a first gap distance from a second gap distance. The first gap distance may be correlated with the first deposition rate corresponding to the nominal deposition rate, and the second gap distance may be correlated with the first deposition rate corresponding to the second deposition rate associated with the location. The determining of the contour profile may also include establishing, for each location, a contour point offset from the reference plane by the gap distance delta determined for the location. Positive gap distance deltas may indicate that the contour point may be offset in a direction towards the substrates when the contoured showerhead faceplate is used in the semiconductor manufacturing process, and negative gap distance deltas may indicate that the contour point may be offset in a direction away from the substrates when the contoured showerhead faceplate is used in the semiconductor manufacturing process.

In some implementations, the method may further include manufacturing a contoured faceplate with a surface defined by the contour profile. In some further implementations, the method may also include contouring an interior surface of the faceplate with a second contour profile offset from the contour profile in a direction normal to the reference plane.

In some implementations, each first deposition rate may be an average deposition rate. In some implementations, the average deposition rate may be the average across substantially all of the reference substrate.

In some implementations, the first deposition rates in the first deposition rate data may be grouped into datasets, each dataset corresponding to a particular radial position from the center of the reference substrate, and each second gap distance may be determined by interpolating between intermediary gap distances drawn from two or more of the datasets, where each intermediary gap distance may be determined by interpolating between first deposition rates in the data set from which the intermediary gap distance is drawn.

In some implementations of the method, each location may correspond to a radial distance from a center axis passing through a center of the reference substrate and each second deposition rate may be an average deposition rate at each radial distance.

In some implementations of the method, the gap distance correlated with the first deposition rate corresponding to the nominal deposition rate may be determined by interpolating between data points in the first deposition rate data. In some implementations of the method, the gap distance correlated with the first deposition rate corresponding to the second deposition rate associated with the location may be determined by interpolating between data points in the first deposition rate data.

In some of the implementations of the method, the reference showerhead faceplate may be a flat faceplate. In some implementations, the one or more portions of the reference showerhead faceplate may include an annular region of the reference showerhead faceplate.

In some implementations, the contour profile may be flat at radial distances from the center of the contoured faceplate less than the inner annular radius of the annular region, and may vary at radial distances from the center of the contoured faceplate that are greater than the inner annular radius of the annular region.

In some implementations, the one or more portions of the reference showerhead faceplate may include a region of substantially the same nominal size as the reference substrate. In some implementations, the contour point offsets may include both negative gap distance deltas and positive gap distance deltas. In some implementations, the contour profile may deviate from the reference plane by an amount greater than a flatness tolerance zone of the reference showerhead faceplate. In some implementations, the contour profile may deviate from the reference plane by an amount greater than 0.010" per 3".

In some implementations, the one or more portions of the reference showerhead faceplate may correspond with one or more areas of the reference substrate experiencing pattern loading effects.

In some implementations, a contoured showerhead faceplate having a contour profile determined according to the method of claim 1 may be provided.

In one implementation, a showerhead faceplate for use in a semiconductor manufacturing tool may be provided. The showerhead faceplate may include a substantially circular structure having a bottom surface and a center axis. When the showerhead faceplate is used in a semiconductor manufacturing process, the bottom surface may face a substrate that is subject to the semiconductor manufacturing process. The substantially circular structure may include a plurality of gas distribution holes that pass through the circular structure and a bottom surface that is contoured and has a radial profile that varies with respect to normal distance from a reference plane perpendicular to the center axis.

In some further implementations, the substantially circular structure may also include a top surface opposite, and substantially parallel to, the bottom surface, the top surface defining a portion of an internal plenum volume of the showerhead. The top surface may be contoured in substantially the same manner as the bottom surface such that each of the gas distribution holes has a length substantially equal to the lengths of the other gas distribution holes.

In some further implementations of the showerhead faceplate, the radial profile may vary with respect to normal distance from the reference plane by an amount greater than 0.010" in a region corresponding to the outer 3" of the substrate. In some further implementations, the radial profile may vary with respect to normal distance from the reference plane by an amount less than 0.010" in a region corresponding to the region of the substrate within the outer 3" of the substrate.

In some implementations of the showerhead faceplate, the radial profile may be contoured to provide a plasma density that is more uniform than the plasma density produced using a faceplate with a flat profile coincident with the reference plane. In some implementations, the majority of the bottom surface may be coincident with the reference plane and one or more portions of the radial profile may be offset from the reference plane in a first direction, and one or more portions of the radial profile may be offset from the reference plane in a second direction opposite the first direction.

In some implementations, the radial profile may be contoured in a region between an edge region of the faceplate and the center of the faceplate, the edge region including any edge treatment applied to the edge of the faceplate. In some further implementations, the edge treatment may be a round and the edge region may be offset from the edge by an amount substantially equal to the round radius. In some further implementations, the edge region may be a substantially annular region with an inner diameter larger than the nominal size of the substrate.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale unless specifically indicated as being scaled drawings.

BRIEF DESCRIPTION OF THE DRAWINGS

FIG. 9A depicts a cross-sectional side view of an example of a contoured showerhead.

FIG. 10B depicts the cross-sectional side view of the example showerhead of FIG. 10 but scaled by 600% along one axis.

FIGS. 9A, 9B, 10A, 11A, and 12A are scaled drawings, although the drawing scale may vary from Figure to Figure (the proportions within each Figure are still to-scale, however).

DETAILED DESCRIPTION

Examples of various implementations are illustrated in the accompanying drawings and described further below. It will be understood that the discussion herein is not intended to limit the claims to the specific implementations described. On the contrary, it is intended to cover alternatives, modifications, and equivalents as may be included within the spirit and scope of the invention as defined by the appended claims. In the following description, numerous implementation-specific details are set forth in order to provide a thorough understanding of the present invention. The present invention may be practiced without some or all of these implementation-specific details. In other instances, well-known process operations have not been described in detail in order not to unnecessarily obscure the present invention.

Figure 1A:
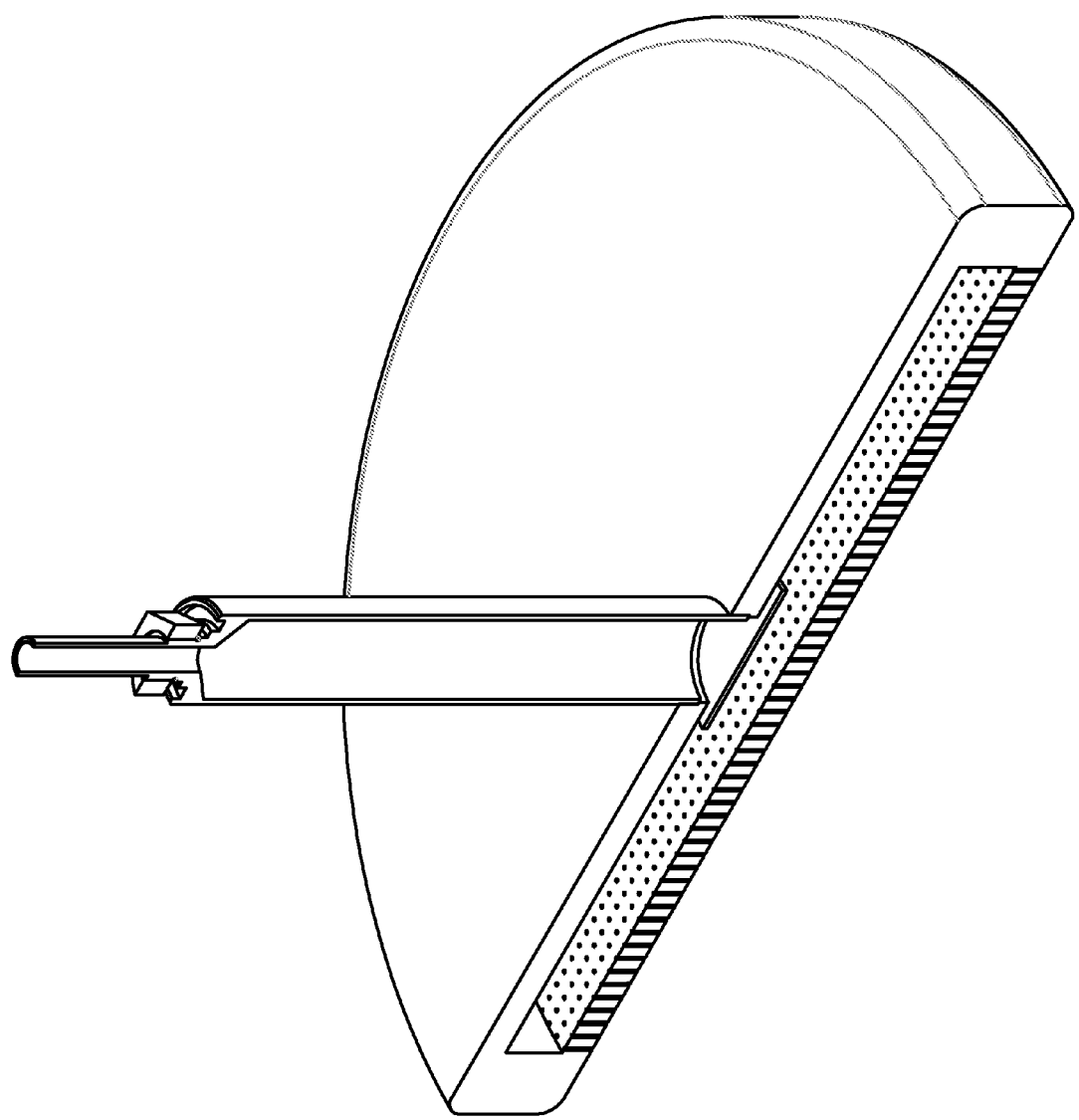
FIG. 1A depicts an isometric, cross-sectioned view of a flat, traditional showerhead; due to the sectioned view, only half of the showerhead is shown.
Figure 1B:
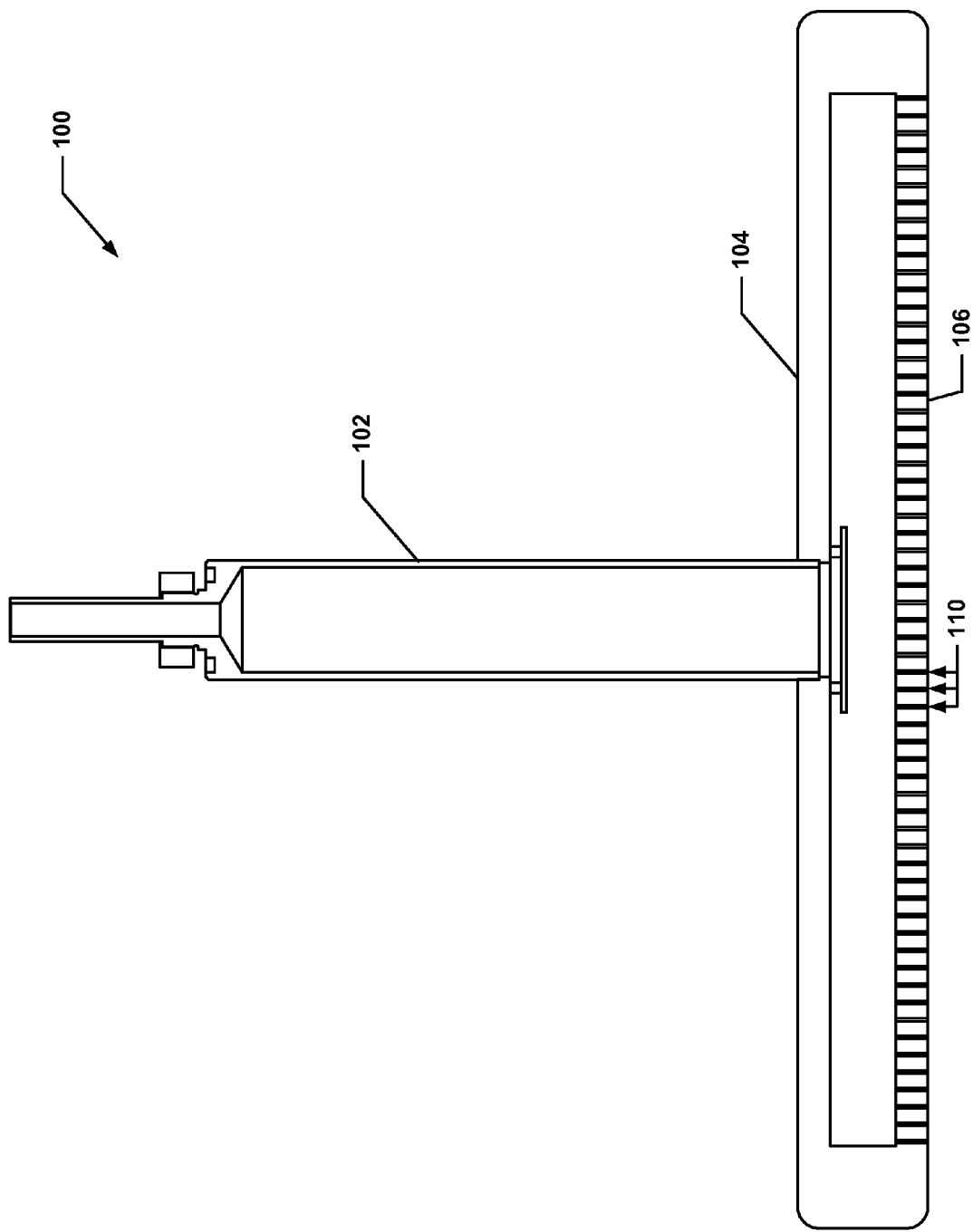
FIG. 1B depicts a cross-sectional side view of the flat, traditional showerhead of FIG. 1A.
Figure 1C:
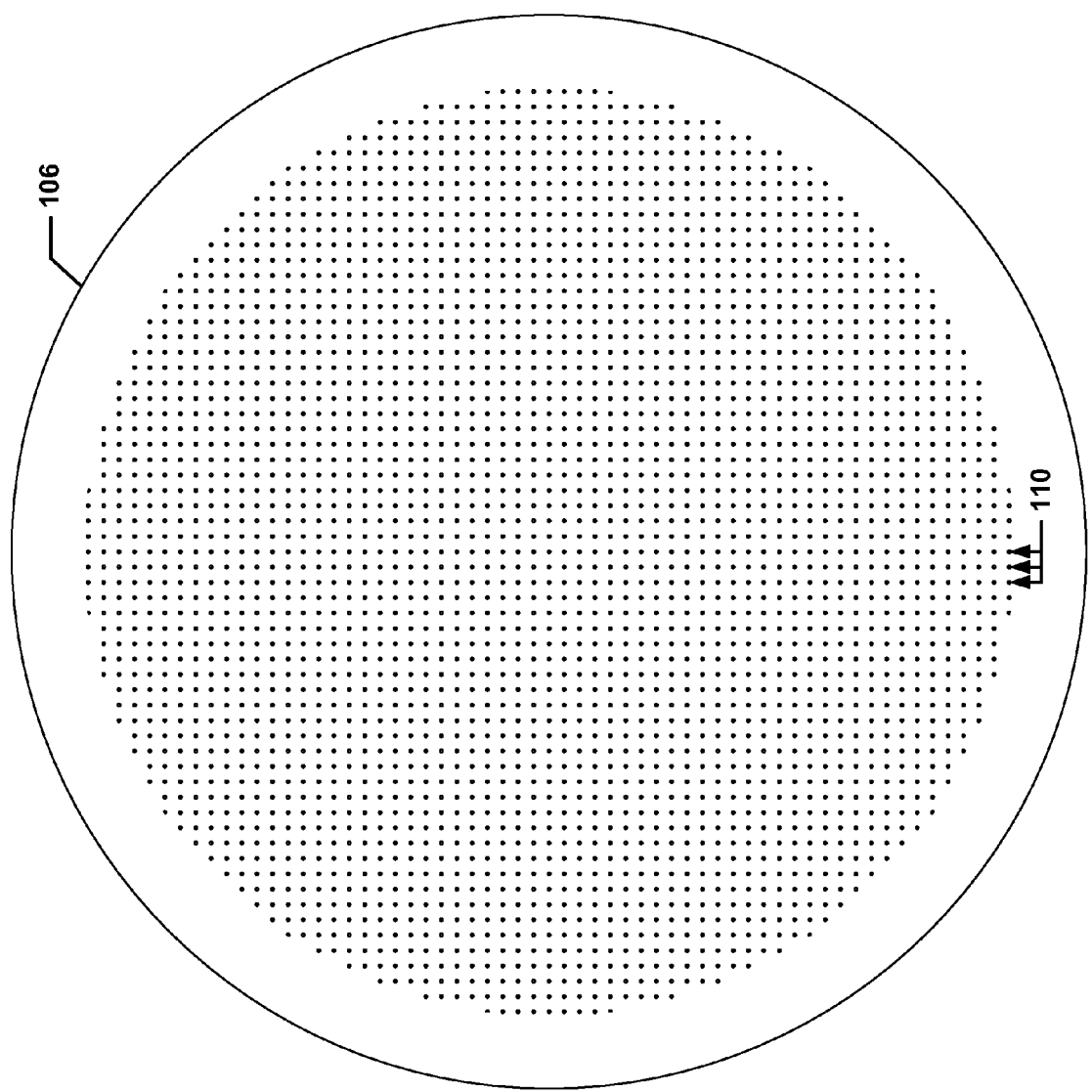
FIG. 1C depicts an un-sectioned, bottom view of a flat, traditional showerhead.

FIG. 1A depicts an isometric, cross-sectioned view of a flat, traditional showerhead; due to the sectioned view, only half of the showerhead is shown. FIG. 1B depicts a cross-sectional side view of the flat, traditional showerhead of FIG. 1A. FIG. 1C depicts an un-sectioned, bottom view of a flat, traditional showerhead.

As can be seen in FIGS. 1A-1C, a traditional showerhead 100 may include a stem 102 that supports a backplate 104 and, via the backplate 104, a flat faceplate 106. The flat faceplate 106 may be bonded or welded to the backplate 104 in some implementations, or may be removably connected, e.g., using threaded fasteners. The space between the flat faceplate 106 and the backplate 104 may form a plenum volume into which process gases are introduced, and the gases may then flow through through-holes 110 in the flat faceplate 106 and towards the substrate. For clarity, various other features of the showerhead, e.g., weld seams, heaters, internal plumbing, fasteners, etc., have been omitted in this figure, and may also be omitted in other figures in this application. While through-holes 110 are shown in FIGS. 1A-1C, similar through-holes may not be shown in other Figures in this application for clarity. In practice, the faceplates of showerheads shown in the Figures of this application may be modified to have patterns of through-holes as needed in order to convey process gases from the interior volume of the showerhead to the substrate processing area. These patterns may result in a substantially uniform distribution of holes across the showerhead faceplate, or may result in various densities of holes across the faceplate.

As can be further observed, the traditional showerhead 100 of FIG. 1 features a non-contoured flat faceplate 106, i.e., the flat faceplate 106 is essentially planar across its entire span. Showerhead faceplates such as flat faceplate 106 may feature edge treatments, such as rounding (as shown in this example), towards the edge of the flat faceplate 106 that deviate from the general planar nature of the flat faceplate, but such features are typically located at distances beyond the edge of the substrates processed by the traditional showerhead 100. Such features may also be designed to avoid potential arc-generation locations, e.g., sharp edges, and are generally constrained to the outermost edge of the flat faceplate 106. It is to be understood that such edge treatments are not to be viewed as forming a "contoured" faceplate as described later in this document.

While the traditional showerhead 100 of FIG. 1 and the other showerheads depicted in this application are "chandelier" type showerheads, e.g., the showerhead backplate and faceplate may be suspended from the top of a semiconductor processing chamber by the stem 102, the techniques and showerhead faceplates discussed herein may also be used in "flush-mount" type showerheads, e.g., showerheads that, instead of being supported by a stem near the center of the showerhead, are supported about the periphery of the showerhead and that may form part of the roof of a semiconductor processing chamber. This disclosure is to be understood to apply to faceplates suitable for use with either type of showerhead.

Traditional showerheads, such as the one shown in FIG. 1, may generate non-uniformities in various semiconductor processes involving the generation of plasma in between the showerhead faceplate and the substrate. Depending on various environmental conditions, the plasma density of such a plasma may vary with location and, left uncorrected, result in non-uniformity in deposition processes performed using the plasma.

Figure 2:
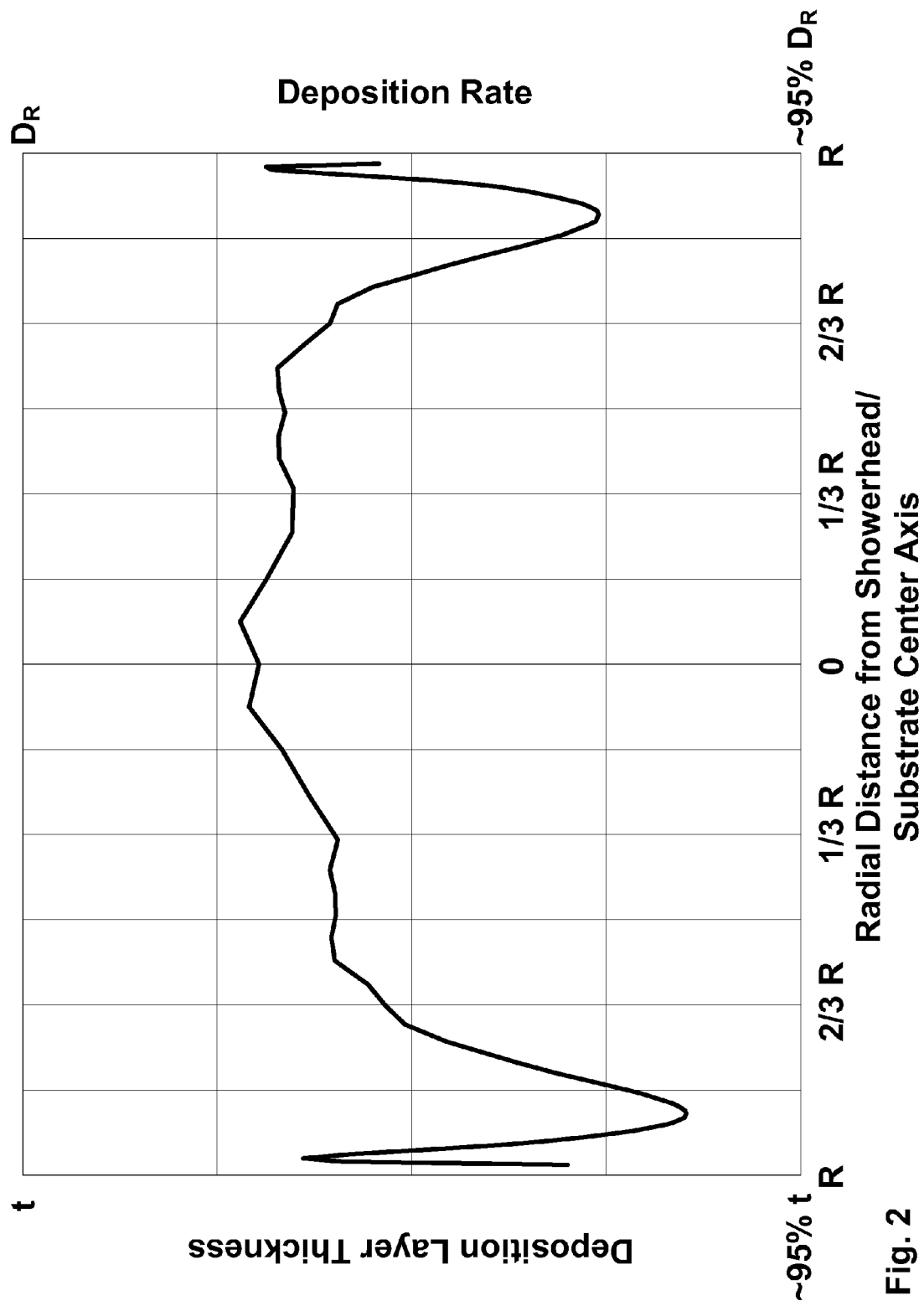
FIG. 2 depicts an example plot of deposition layer thickness/deposition rate on a substrate as a function of the radial distance from the center of the substrate.

For example, in a deposition process the thickness of the deposition layer may vary across the substrate, e.g., deposition layer thickness may depend substantially on radial position across the substrate. FIG. 2 depicts an example plot of average deposition layer thickness/deposition rate on a substrate processed using a flat faceplate showerhead as a function of the radial distance from the center of the substrate.

As can be seen in FIG. 2, the X-axis of the plot correlates with the radial distance R from the center of the flat showerhead (which generally corresponds to the center of the substrate as well). The Y-axis of the plot correlates with the deposition layer thickness (left axis) and the deposition rate (right axis). Since deposition rate directly determines deposition layer thickness, the Y-axis for this plot may be defined to reference either type of data; the plot behavior will be the same. It should be noted that the plot only shows a detail portion of the overall data plot. In this case, the plot only shows data between a thickness of "t" and approximately 95% of "t." Similarly, the plot only shows a deposition rate between "$D_R$" and approximately 95% of "$D_R$." As can be seen from FIG. 2, while there may be some variation between thickness/deposition rate across a substrate, such data may reflect a generally axisymmetric trend across the substrate, i.e., generally symmetric about the center axis of the substrate. For example, the layer thickness on the substrate drops significantly in the outermost ⅙th of the radius of the substrate before rising again to levels close to those found near the center of the substrate. Such non-uniformities are undesirable. In FIG. 2, there is some non-uniformity across the interior of the substrate, e.g., within a region of approximately ⅔ R. However, in the annular region between ⅔ R and R, the non-uniformities can be seen to have increased markedly. In this case, this means that more than half of the substrate surface area will have deposition layer thicknesses substantially less than the deposition layer thickness towards the interior of the substrate. Other semiconductor processes may, of course, exhibit different non-uniformity patterns, e.g., increased non-uniformity towards the center of the substrate.

A technique for dealing with such non-uniformities is discussed below. The technique has been tested and has resulted in a marked decrease in non-uniformity across processed substrates. At a high level, the technique involves modulation of the substrate-showerhead gap as a function of radius in order to modulate plasma density and, consequently, deposition rate/deposition layer thickness.

Figure 3:
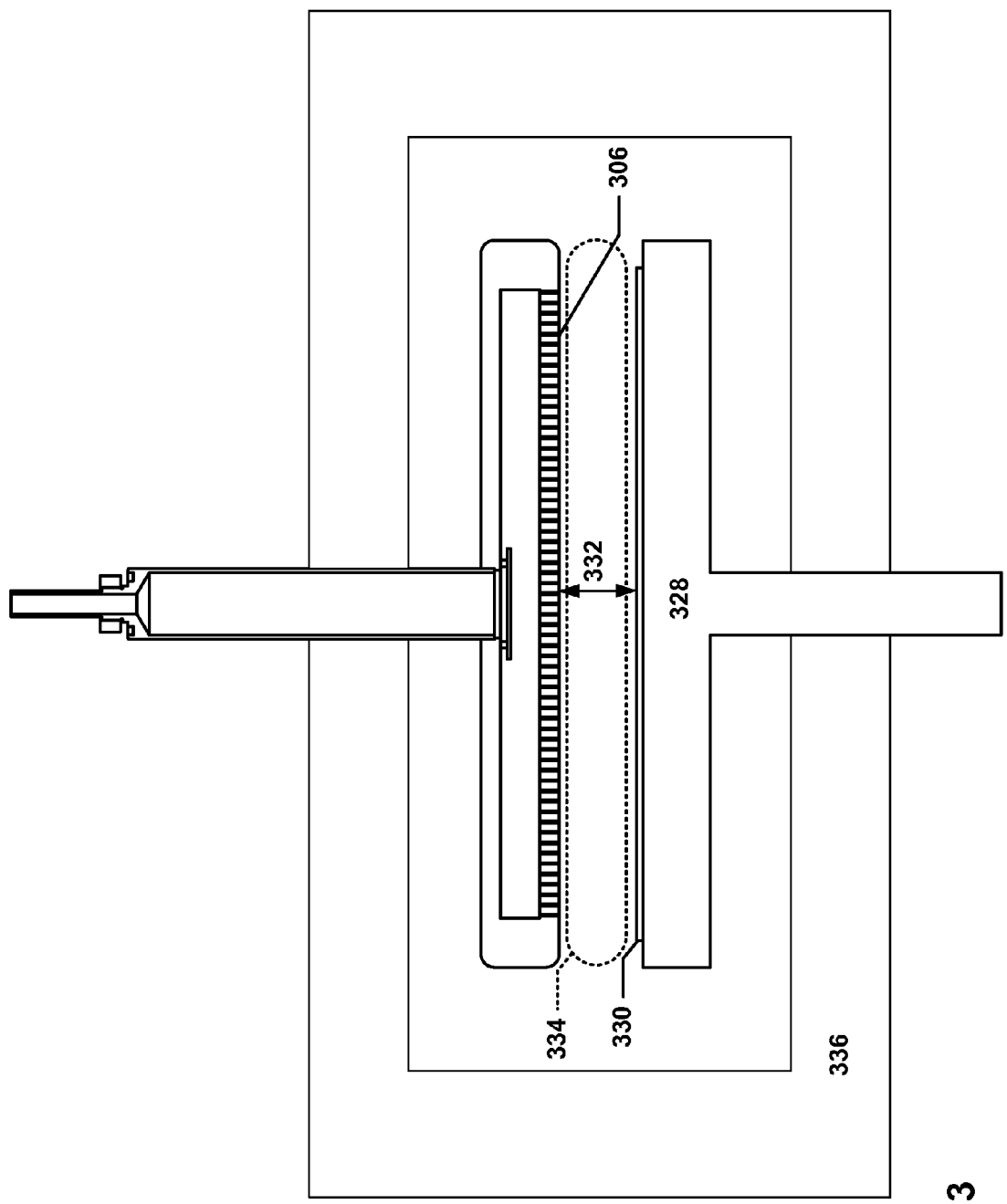
FIG. 3 depicts an example representational view of the relative positions of a showerhead, a substrate, and a substrate support during a semiconductor manufacturing process.

To begin with, two sets of data are obtained. The first dataset represents deposition rates as a function of gap distance. The gap distance is the offset distance between a reference showerhead faceplate and a reference substrate being processed using the reference showerhead. Of course, the gap distance could be measured from other locations as well, such as from the reference showerhead faceplate to a substrate support supporting the reference substrate—regardless of how the gap distance is recorded or measured, it will be possible to determine the offset distance between the reference showerhead faceplate and the reference substrate using the gap distance data. The reference showerhead faceplate may be a flat showerhead faceplate, e.g., similar to the one depicted in FIG. 1. FIG. 3 depicts a high-level view of a traditional showerhead 300 positioned above a substrate 330 supported on substrate support 328 in a semiconductor processing chamber 336. A capacitively-coupled plasma 334 has been formed between the traditional showerhead 300 and the substrate support 328. As can be seen, there is a gap distance 332 between the substrate 330 and flat faceplate 306. The gap distance may be varied by translating the traditional showerhead 300 vertically, translating the substrate support 328 vertically, or translating both structures vertically.

Figure 4:
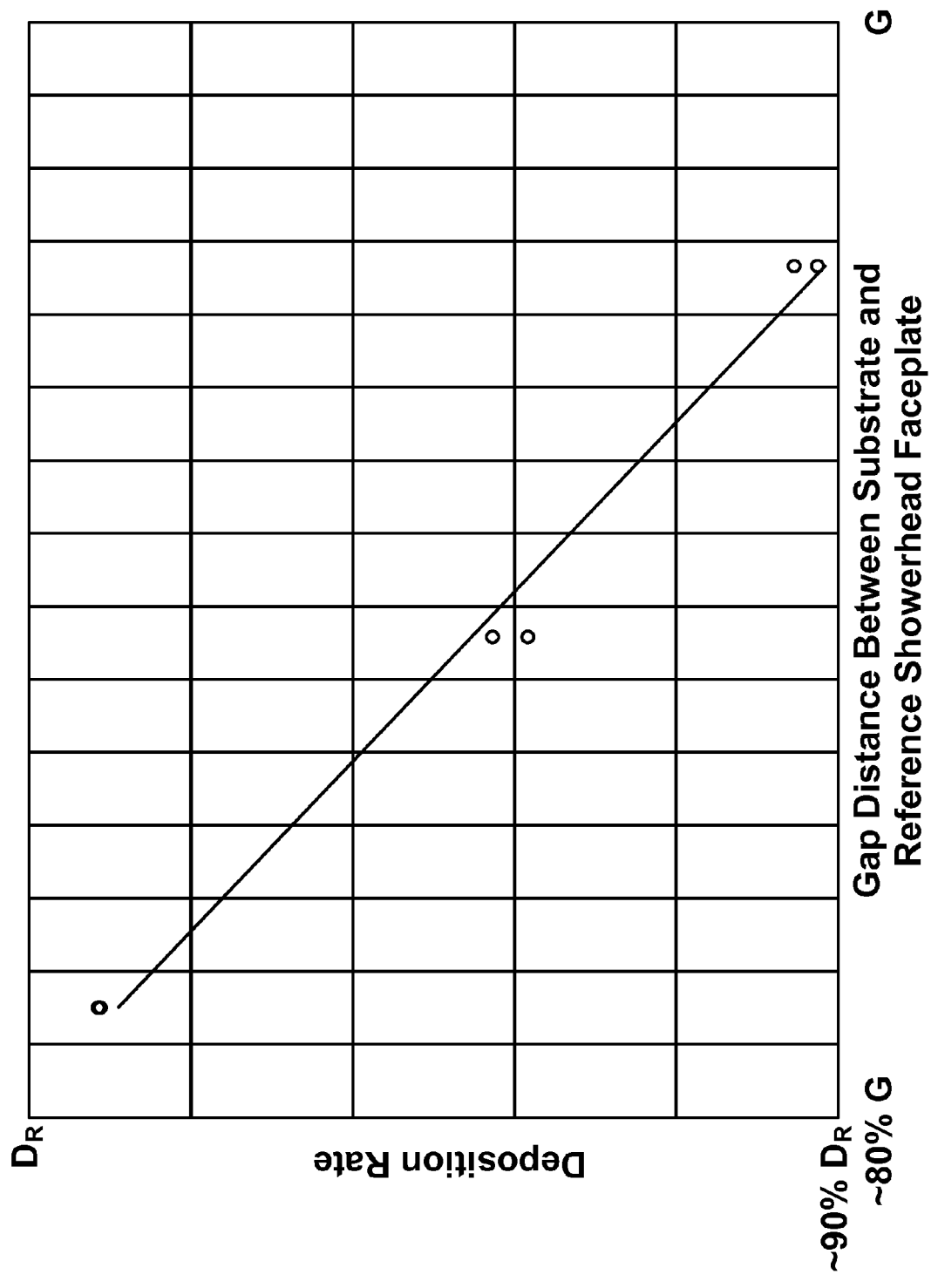
FIG. 4 depicts an example plot of deposition layer thickness as a function of gap distance between the showerhead and the substrate.

FIG. 4 depicts an example plot of deposition layer thickness as a function of gap distance between the reference showerhead faceplate and the reference substrate. As can be seen, the X-axis of this plot represents gap distance between the reference substrate and the reference showerhead faceplate. In this case, the gap distance refers to the gap distance between the reference showerhead faceplate and the reference substrate across most of the reference showerhead faceplate since opposing faces of the reference showerhead faceplate and the reference substrate are both "flat" and generally parallel to each other. The Y-axis represents the measured deposition rate, e.g., as derived based on measured deposition layer thickness divided by deposition time. As can be seen, three pairs of thickness data points were taken at different gap distances. A linear curve fit was performed, e.g., a regression analysis. As can be seen, as gap distance increases, deposition rate decreases. This curve fit captures the relationship, at least for the particular semiconductor process in question and with regard to the reference showerhead and the reference substrate used to gather the data, between the deposition rate and the gap distance. Various techniques, e.g., averaging, may be used to make the first dataset less sensitive to process and measurement variability and more suitable for use in the present techniques.

The second dataset represents the deposition rate or deposition layer thickness as a function of location on the reference substrate or the faceplate for substantially the same semiconductor process as was used to generate the deposition rate v. gap distance dataset (the first dataset) but without varying the gap distance, i.e., the showerhead remains fixed in place with respect to the substrate. The locations may be expressed with respect to a substrate coordinate frame or a faceplate coordinate frame since the substrate and the faceplate are typically in the same relative positioning from substrate to substrate, e.g., each substrate may be substantially centered on the faceplate center axis. FIG. 2 represents one example of such a deposition rate/deposition layer thickness v. location dataset. While it is not a requirement that the same reference showerhead be used to obtain data for both datasets, using different reference showerheads may provide variation in the measured results and reduce the correlation between the first dataset and the second dataset. Thus, the same reference showerhead may generally be used to produce both the first dataset and the second dataset. However, physically different, although nominally identical, reference substrates may be used during each process operation to avoid previously-deposited material on a reference substrate from affecting a data point collected for a subsequent deposition operation. Due to the high precision with which substrates are manufactured, the effects of using different physical reference substrates of the same nominal type/size may be minimal. Even if there is, for example, slight variation in overall thickness between substrates, such variability may be compensated for by measuring the actual gap distance between the reference showerhead faceplate and the reference substrate when a reference substrate is replaced by a new reference substrate of the same nominal size. As with the first dataset, various techniques, e.g., averaging, may be used to make the second dataset less sensitive to process and measurement variability and more suitable for use in the present contouring techniques.

FIG. 2 provides one example of a location-based deposition rate second dataset. Based on data in the first dataset, i.e., deposition rate v. gap distance, and data in the second dataset, deposition rate/deposition layer thickness v. location, one or more portions of a showerhead faceplate may be contoured to produce a non-flat faceplate showerhead. The contoured portions of such a faceplate may locally alter the deposition rate experienced in corresponding areas on a substrate. Thus, as a result of contouring, the deposition rate in the contoured regions may be increased or decreased from a baseline/reference/nominal deposition rate and potential non-uniformities thus preemptively addressed. The contour definition process is described further below.

Figure 5A:
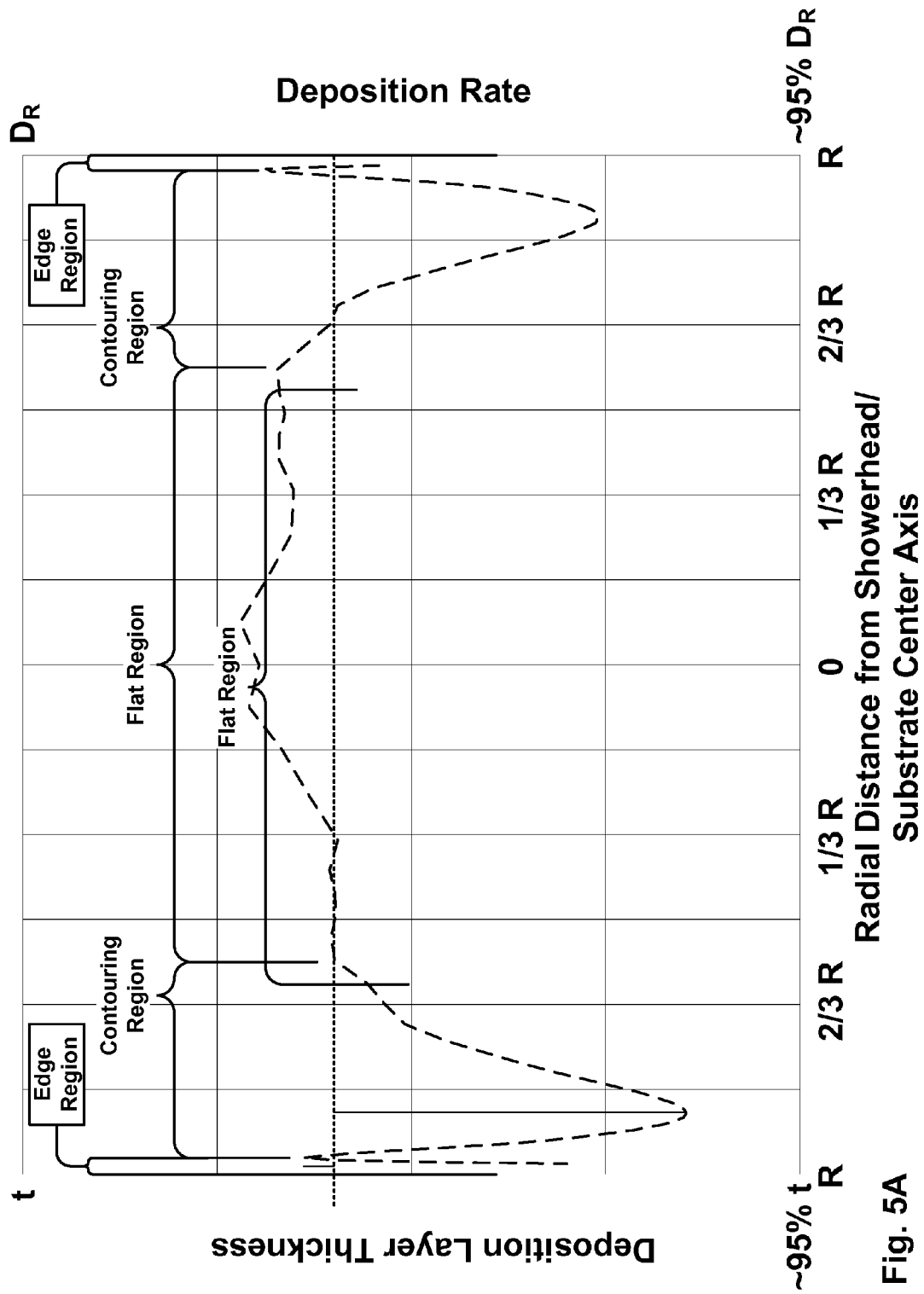
FIG. 5A shows the example plot of FIG. 2 with additional annotations.

FIG. 5A shows the example deposition rate/deposition layer thickness v. location plot of FIG. 2 with additional annotations. In FIG. 5A, brackets indicate regions of the faceplate in question that have been selected to be contoured, and portions of the faceplate that will remain "flat." It should be noted that the data plotted in FIG. 5A is representative of data from a traditional, flat showerhead rather than a contoured showerhead; the bracketed regions merely indicated regions of a faceplate that would be contoured (and also provide an indicator of the non-uniformities that may be addressed by such contouring). Such regions may be determined according to various factors. In the present example, the non-uniformity present in the indicated "flat region" may be sufficiently uniform that contouring in the flat region of the faceplate is deemed to be unnecessary. Similarly, edge effects near the edge of the substrate or of the faceplate may result in significant non-uniformity localized to the edge region that cannot be tempered using contouring of the faceplate. Thus, the contouring region in this example does not extend all the way to the faceplate edge. This is not to say that the faceplate is "flat" in the outer edge, but simply that the contouring techniques described herein may, in some cases, not be used to define the faceplate in close proximity to the faceplate edge, e.g., immediately adjacent to the edge.

It is to be understood that, in some implementations, there may not be a "flat region," i.e., substantially the entire faceplate surface may be contoured. It is also to be understood that, in some implementations, there may be multiple, discontinuous flat and/or contoured regions depending on the particular non-uniformities that are addressed. For example, a center region of a contoured faceplate and an outer annular region of the contoured faceplate may both be "flat," but be joined by a contoured annular region interposed between the two flat regions. In some implementations, the contoured region may include "flat" areas, e.g., a flat region that is offset from another flat region towards or away from the substrate. One such implementation may be seen in FIGS. 10A and 10B, discussed later in this document.

Also visible in FIG. 5A is a dotted horizontal line indicating a nominal deposition rate/deposition layer thickness associated with a reference plane. The nominal deposition rate/deposition layer thickness may be the target deposition rate/layer thickness for a desired semiconductor process.

In some implementations, the second dataset, i.e., the deposition rate/deposition layer thickness v. location dataset, may be obtained from a process run or runs in which the gap distance correlates with the gap distance between the reference plane and the substrate. In the illustrated case, the reference plane corresponds with the flat region of the showerhead and the gap distance associated with this flat region may be equivalent to the gap distance from the first dataset that corresponds with the nominal deposition rate/deposition layer thickness.

In some implementations, the present techniques may be used to re-design a traditional flat-faceplate showerhead to produce lesser amounts of non-uniformity. The traditional flat-faceplate showerhead, in this example, may be in use in a semiconductor processing environment in association with a specified gap distance that produces desired deposition layer thicknesses over one region of the substrate, but that also produces undesirably non-uniform deposition layer thicknesses on the substrate outside of that region. For convenience, the traditional flat-faceplate showerhead may serve as the reference showerhead, and the flat faceplate surface facing the substrate during processing may be designated as the reference plane. Substrates processed using the traditional flat-faceplate showerhead may be used as the reference substrates used to collect data for the second dataset. The gap distance associated with the reference plane in this case may simply be the gap distance used during normal processing using the traditional flat-faceplate showerhead.

Figure 5B:
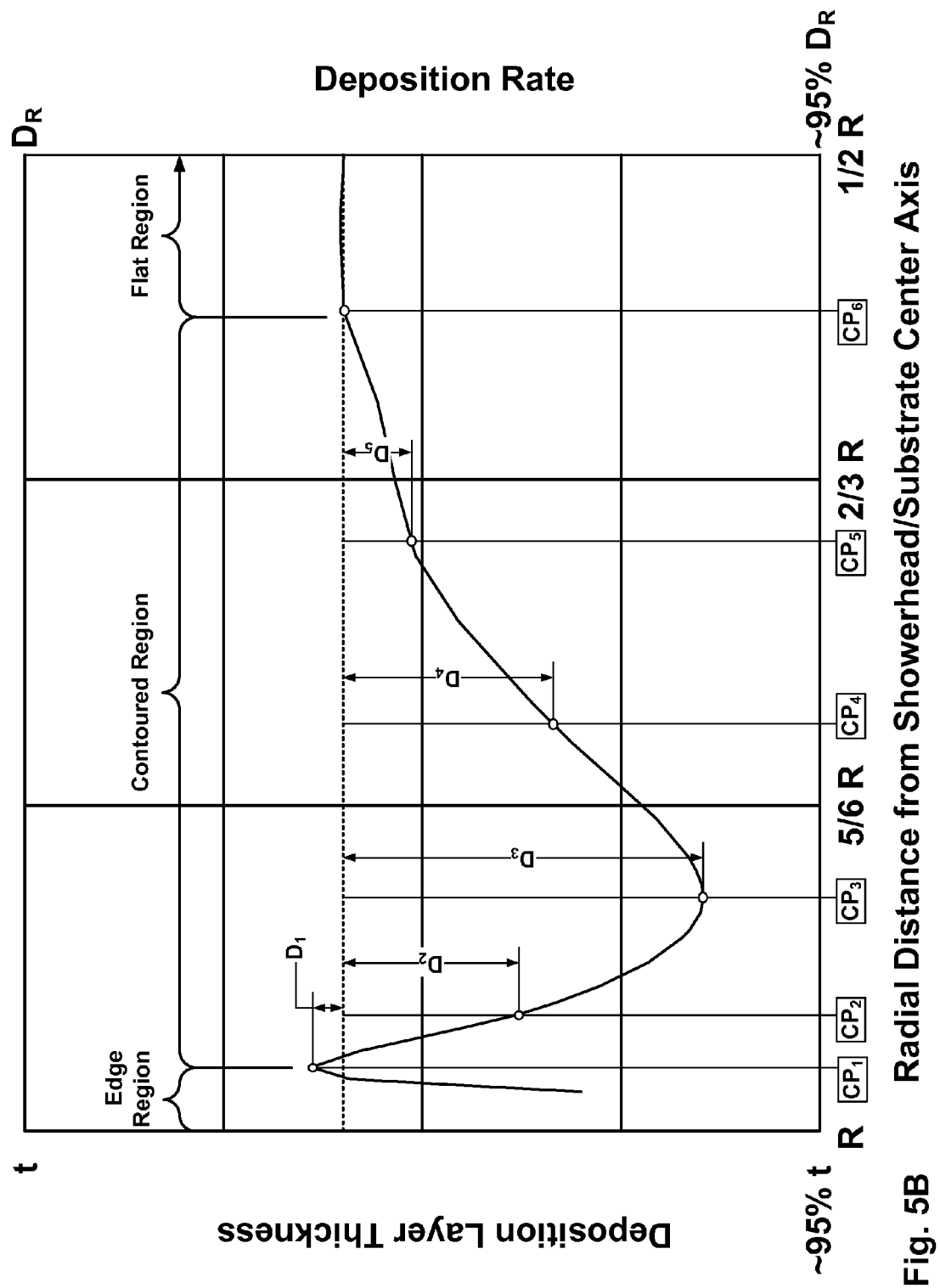
FIG. 5B shows a detail of the plot of FIG. 5A in one of the contoured regions.

FIG. 5B shows a detail of the plot of FIG. 5A in one of the contoured regions. As can be seen in FIG. 5B, several points of interest along the plot have been identified ($CP_1$, $CP_2$, $CP_3$, $CP_4$, $CP_5$, and $CP_6$). As can be seen, the deposition rates at these points deviate from the reference plane deposition rate by amounts $D_1$, $D_2$, $D_3$, $D_4$, and $D_5$. These points of interest will also serve as points that define, at least in part, the contour profile of the faceplate; they may be thought of as contour points. As can be seen, at contour point $CP_1$, the deposition rate is slightly elevated as compared with the reference plane deposition rate. At contour point $CP_3$, the deposition rate is substantially depressed. At contour points $CP_2$ and $CP_4$, the deposition rate is approximately halfway between the depressed condition at contour point $CP_3$ and the reference plane deposition rate. At contour point $CP_5$, the deposition rate is slightly depressed. Contour point $CP_6$ marks the start of the flat region; in effect, contour point $CP_6$ is associated with a deposition rate that is, in this example, equal to the reference plane deposition rate. In practice, contour points may be selected as needed to define a contour. For example, contour points may be selected to occur every 0.1" along a radius of the showerhead faceplate. Higher or lower densities of contour points may be used as well, as well as contour points that are not evenly spaced from one another. For example, it may be desirable to use closely-spaced contour points in regions where there are dramatic changes in uniformity and less-dense contour point spacing in regions where there are gradual changes in uniformity.

After determining contour points, a determination may be made as to how far to offset the surface of the faceplate from the reference plane at each contour point location in order to redefine the local gap distance between the faceplate and the substrate associated with the contour point and increase or decrease the deposition rate on the substrate at that location such that non-uniformities are reduced. Such offsets may be determined using techniques such as those outlined below.

Figure 6:
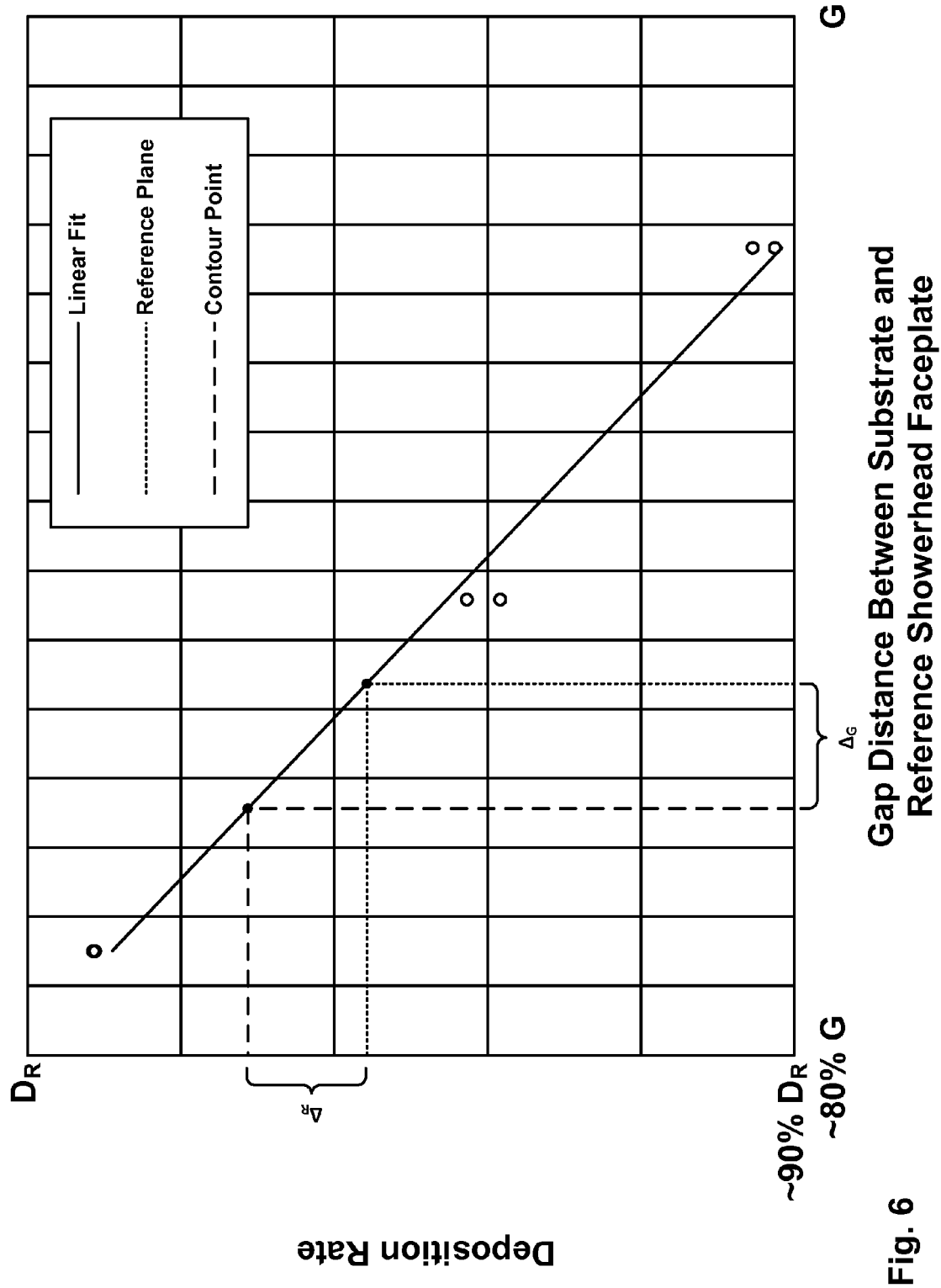
FIG. 6 depicts a plot of deposition rate v. gap distance.

FIG. 6 depicts a plot of deposition rate v. gap distance and serves as a useful vehicle for discussing an example of determining a faceplate surface offset at a contour point. FIG. 6 depicts the deposition rate v. gap distance plot of FIG. 4, but with additional annotations. As can be seen, the dotted lines represent the deposition rate and gap distance associated with the reference plane. The dashed lines represent the deposition rate and gap distance for a particular contour point. The difference between the gap distances that correlate with the deposition rates of the reference plane and the contour point may be used to determine the amount of offset needed between the reference plane and the contour point.

For example, the amount of offset for the contour point illustrated in FIG. 6 may be calculated by subtracting the gap distance of FIG. 6 associated with the reference plane deposition rate from the gap distance of FIG. 6 associated with the contour point. If the offset is positive, the surface of the showerhead at the contour point may be offset from the reference plane by an amount corresponding to the offset and in a direction towards the substrate processing area. If the offset is negative, as it would be with regard to the contour point shown in FIG. 6, the surface of the showerhead at the contour point may be offset from the reference plane by an amount corresponding to the offset and in a direction away from the substrate processing area.

Similar results may be obtained, for example, by subtracting the deposition rate associated with the reference plane from the deposition rate associated with the contour point and then multiplying the difference by the slope of the linear relationship describing the first dataset. Of course, this technique may need to be modified accordingly in cases where the first dataset yields a non-linear relationship. In the case of FIG. 6, the deposition rate associated with the reference plane is smaller than the deposition rate associated with the contour point, and the difference between the two values would therefore be positive. However, the linear function describing the first dataset slopes down to the right, i.e., is negative, and the resulting offset calculated by multiplying the positive difference by the negative slope would be negative. Again, if the offset is positive, the surface of the showerhead at the contour point may be offset from the reference plane by an amount corresponding to the offset and in a direction towards the substrate processing area. If the offset is negative, as it would be with regard to the contour point shown in FIG. 6, the surface of the showerhead at the contour point may be offset from the reference plane by an amount corresponding to the offset and in a direction away from the substrate processing area.

Of course, mathematically equivalent techniques may also be used to determine the offset; such mathematically equivalent techniques should be understood to be within the scope of this disclosure as well. For example, defining different conventions for positive and negative offsets may result in a superficially different technique, but would operate on the same general principles as discussed herein and would be within the scope of this disclosure.

Figure 7:
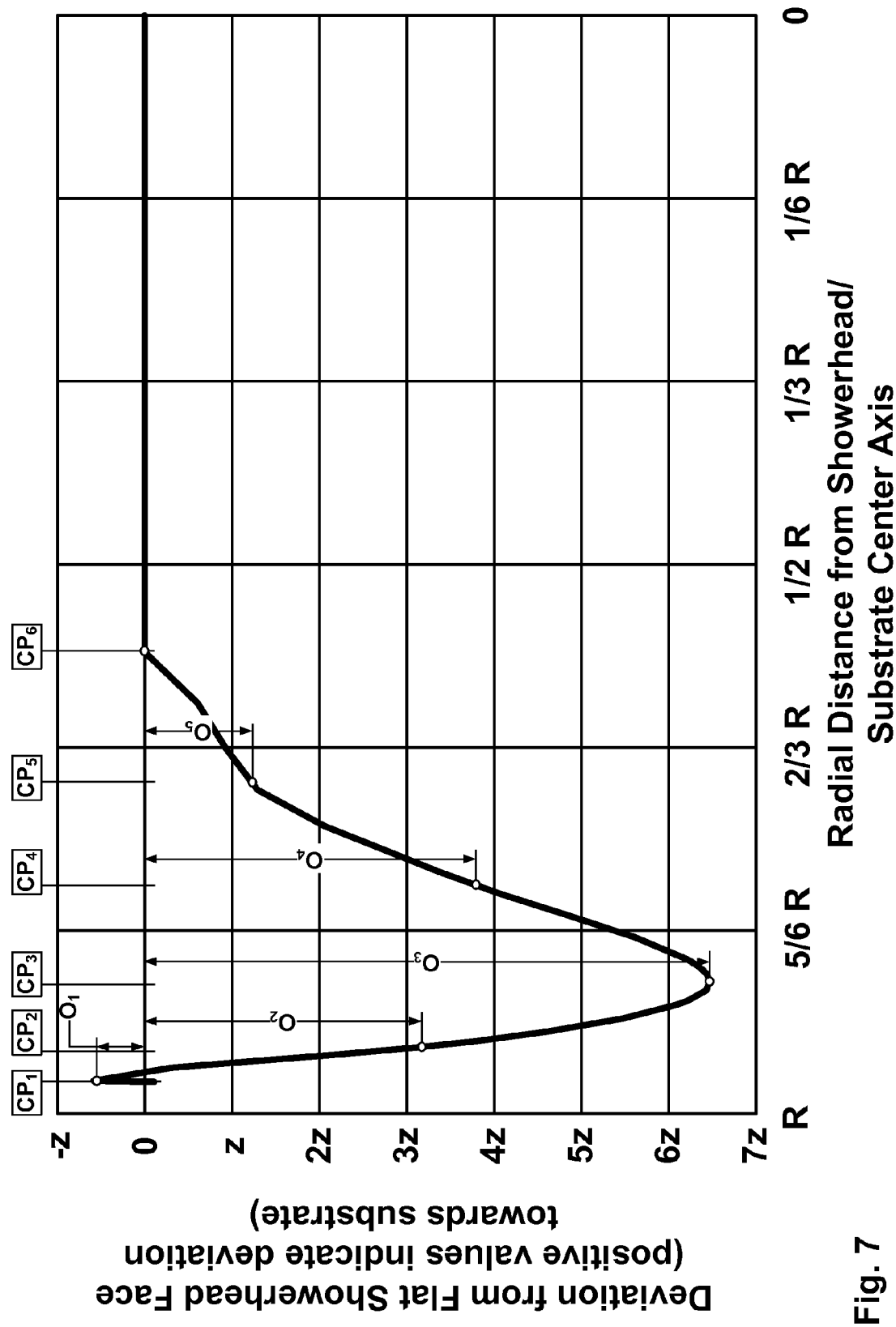
FIG. 7 depicts an example plot of the offset of a showerhead contour from a reference plane as a function of distance from the center of a substrate.

The above techniques may be repeated for each contour point identified, and a contour may be established based on the resulting offsets, i.e., a contour profile may be drawn through the offsets from the contour points. FIG. 7 depicts an example plot of the offset of a showerhead contour from a reference plane as a function of distance from the center of a substrate. In FIG. 7, the contour profile is determined by the offset distances $O_1$, $O_2$, $O_3$, $O_4$, and $O_5$ for contour points $CP_1$, $CP_2$, $CP_3$, $CP_4$, and $CP_5$, respectively. No offset is shown for $CP_6$ since the offset is 0 in this case. As can be seen, the overall shape of the contour profile correlates with the overall shape of the deposition rate data in the same regions, although scaled differently along the centerline of the substrate/showerhead faceplate. If desired, the resulting contour may be smoothed, e.g., a spline may be drawn through the offsets, to account for any undesired sharp edges.

Figure 8:
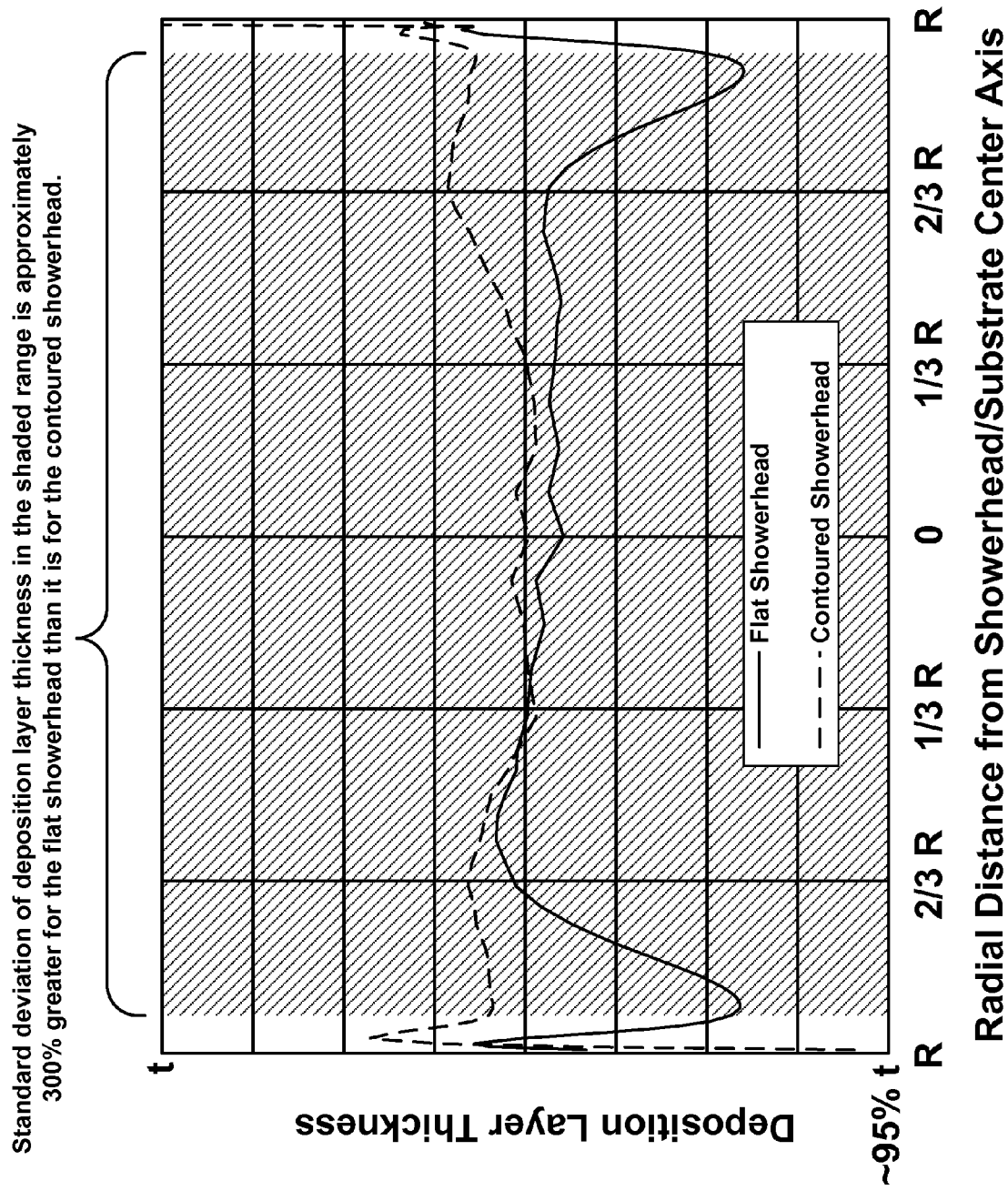
FIG. 8 depicts an example plot comparing the deposition layer thickness data of FIG. 2 to deposition layer thickness data collected using a contoured showerhead.

Such contoured showerheads may provide significant performance increases over traditional flat showerheads. FIG. 8 depicts an example plot comparing the deposition layer thickness data of FIG. 2 to deposition layer thickness data collected using a contoured showerhead. As can be seen, the deposition layer thickness for the contoured showerhead (dashed line) is much more uniform than the deposition layer thickness for the flat showerhead. For example, in the shaded region, the standard deviation for the deposition layer thickness achieved with the flat showerhead is approximately 300% greater than the standard deviation of the deposition layer thickness achieved with the contoured showerhead.

Figure 9B:
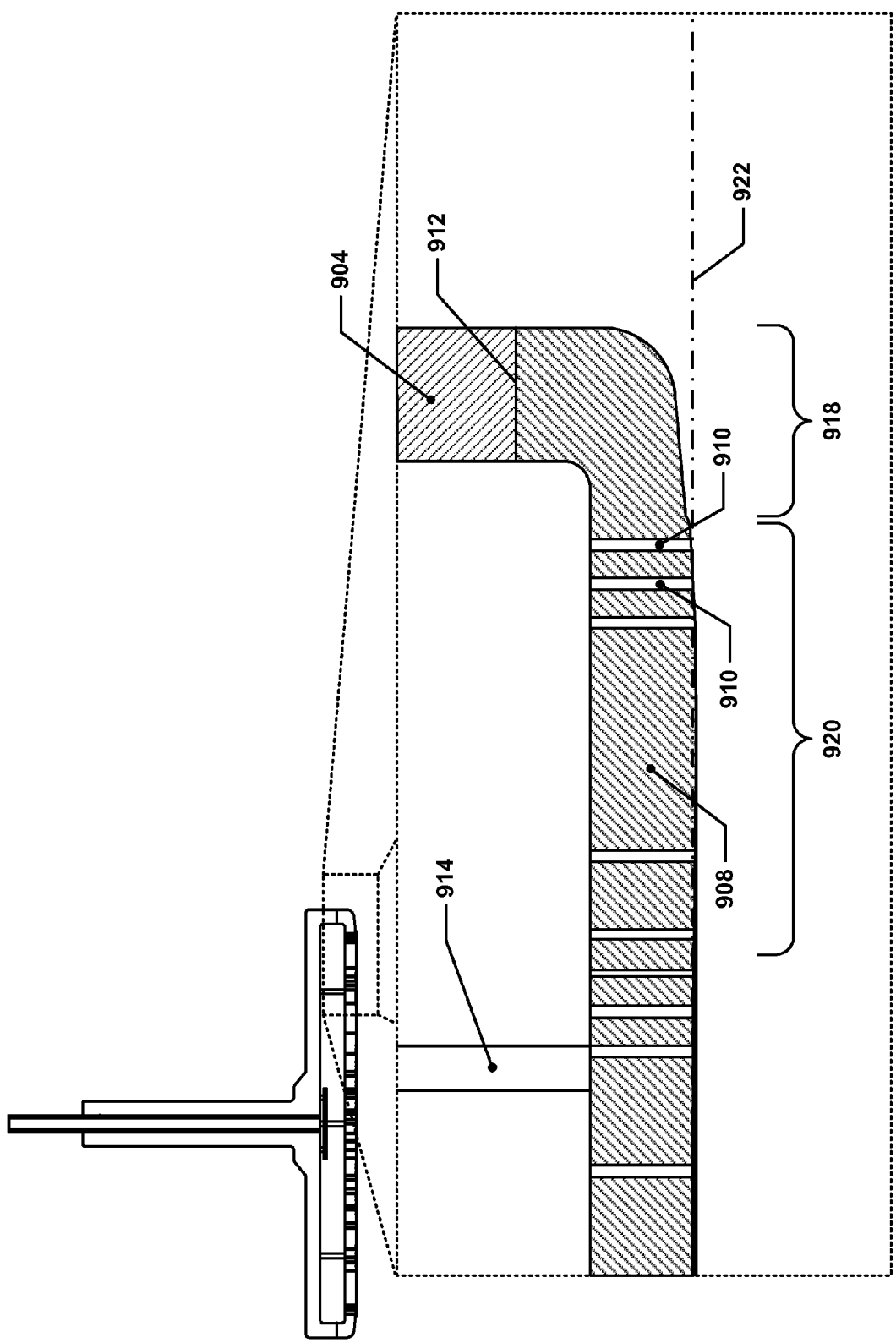
FIG. 9B depicts a detail view of a portion of the contoured showerhead of FIG. 9A.

The offsets used to contour a showerhead faceplate may, in practice, often be quite small and largely imperceptible to the human eye due to their small dimensions and gradual transitions. FIG. 9A depicts a cross-sectional side view of an example of a contoured showerhead 901. FIG. 9B depicts a detail view of a portion of the contoured showerhead 901 of FIG. 9A. As can be seen in these Figures, a slight taper appears to be visible about the periphery of a contoured faceplate 908 in edge region 918. It should be noted that there are multiple through-holes 910 visible in the contoured faceplate 908. These through-holes 910 may appear to be non-uniformly distributed across the contoured faceplate 908, but this is an artifact of the section plane used. In practice, the through-holes 910 are relatively uniformly distributed for this particular contoured showerhead 901.

Also visible in FIGS. 9A and 9B are stem 902, baffle 916, backplate 904, standoffs 914, and bond/weld interface 912, which may be used to join the contoured faceplate 908 to the backplate 904.

While the contoured region is barely visible in FIG. 9A, FIG. 9B shows the contoured region in greater detail (including a reference line indicating reference plane 922). As can be seen in FIG. 9B, the contouring in contour region 920 can be quite subtle while still producing dramatic effects on semiconductor processing.

Figure 9C:
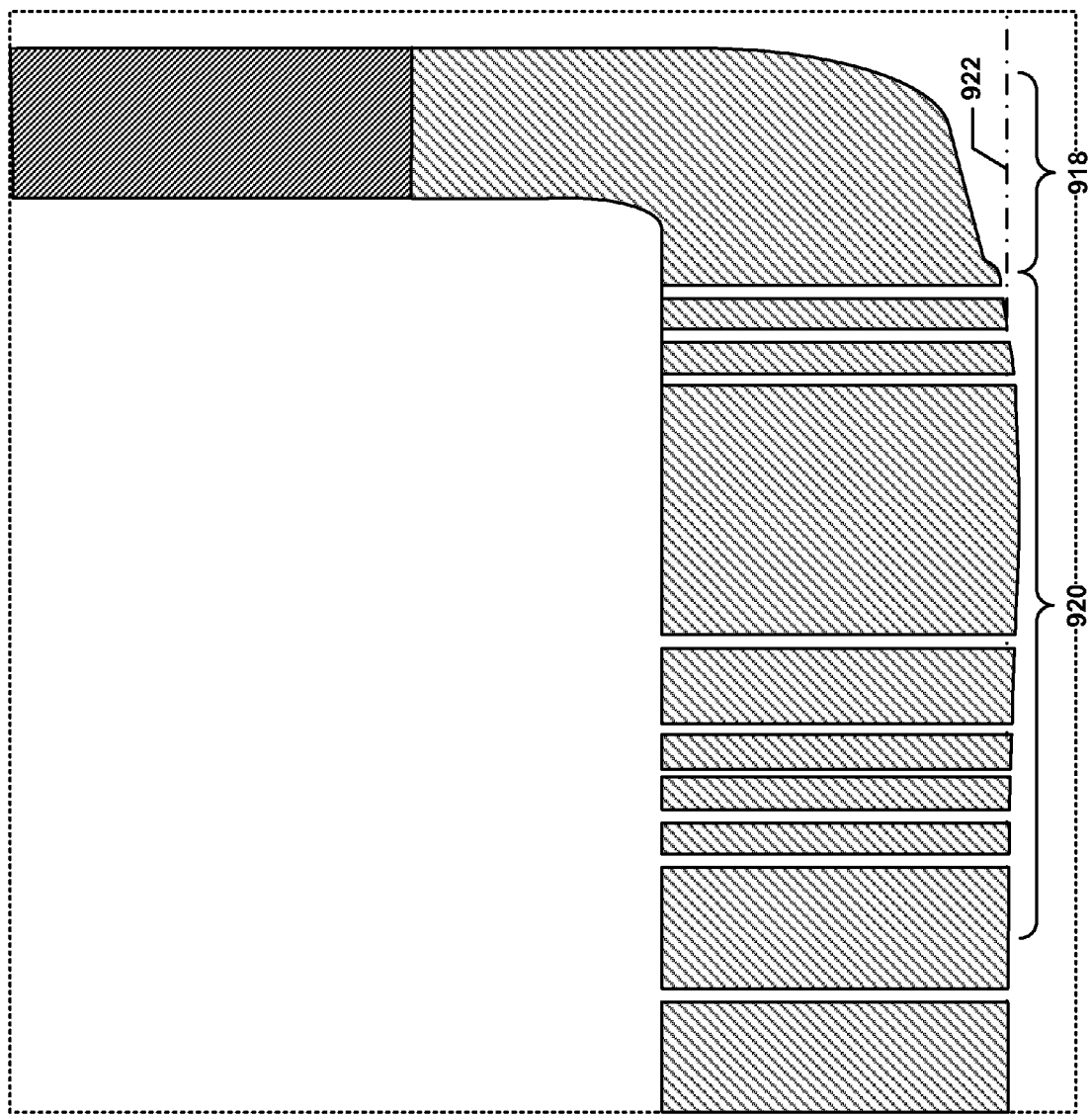
FIG. 9C depicts a removed section side view of FIG. 9B but scaled 300% along one axis.

FIG. 9C depicts a removed section side view of FIG. 9B but scaled 300% along one axis. FIG. 9C thus exaggerates the contouring of the contoured showerhead 901 along one axis, allowing the contour to be easily discerned by the reader.

Figure 9D:
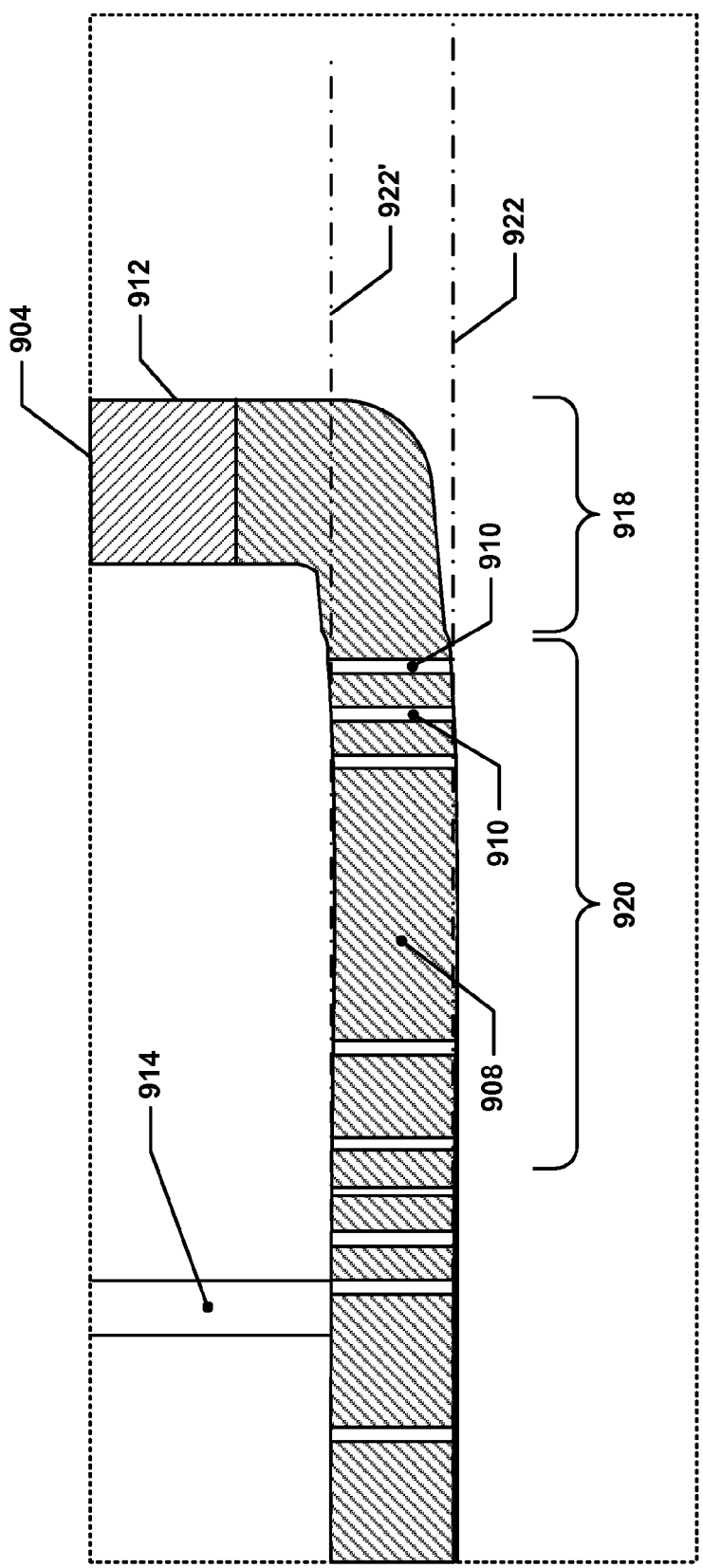
FIG. 9D depicts a detail view of a portion of the contoured showerhead of FIG. 9A, but with additional, interior contouring.

FIG. 9D depicts a detail view of a portion of the contoured showerhead of FIG. 9A, but with additional, interior contouring. For example, as a result of the contouring of the face of the faceplate that will be oriented towards the semiconductor substrate during processing, the passage lengths of the through-holes through the faceplate may vary across the faceplate depending on the contour used. Some implementations may address such variance by contouring the opposite face of the faceplate, i.e., the face that forms part of the plenum volume within the showerhead, with a matching contour. In this manner, the faceplate thickness remains at a relatively uniform value and the passage lengths of the through-holes across the faceplate may be kept substantially the same, thus reducing the risk of further non-uniformities.

Figure 10A:
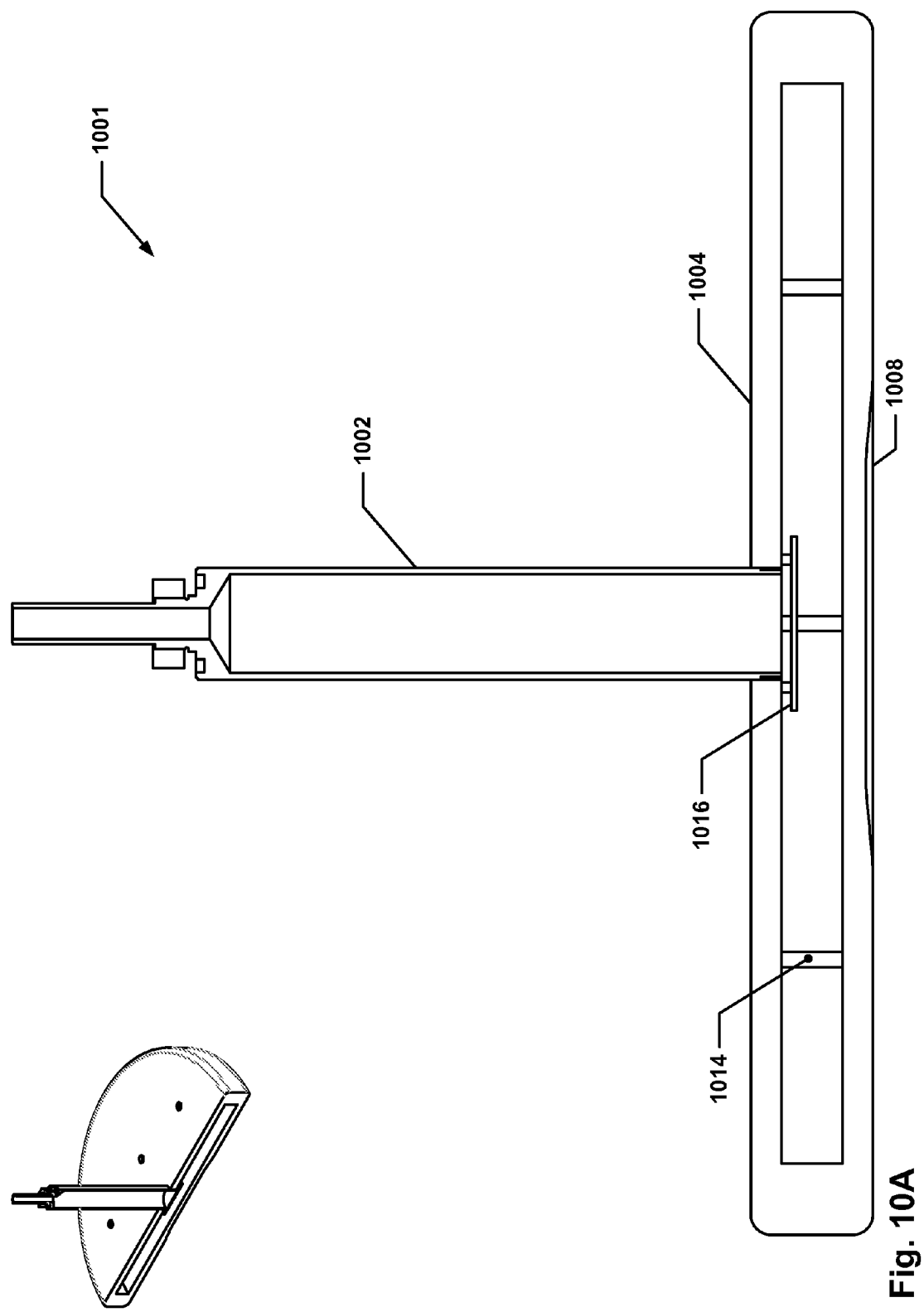
FIG. 10A depicts a cross-sectional side view of an example of another contoured showerhead.

FIG. 10A depicts a cross-sectional side view of an example of another contoured showerhead. In this example, the contouring in question occurs in the interior region of contoured showerhead 1001, and is clearly visible in the section view shown. This example demonstrates that the selection of a reference plane may be somewhat arbitrary. For example, with respect to the implementation shown in FIG. 10A, the reference plane may be defined to coincide with the outer, flat portion of the contoured faceplate closest to the substrate processing area, and the inner portion of the contoured faceplate may then be offset away from the reference plane and the substrate processing area. Alternatively, the reference plane may be defined to coincide with the inner, flat portion of the contoured faceplate and the outer portion of the contoured faceplate may then be offset towards the substrate processing area. In either situation, the portions of the faceplate are offset from a designated reference plane, and the resulting contour geometry will be the same.

FIG. 10B depicts the cross-sectional side view of the example showerhead of FIG. 10A but scaled by 600% along one axis. Also visible in FIG. 10B are two reference planes. First reference plane 1024 corresponds to the reference plane coincident with the inner flat portion of the contoured faceplate 1008, and second reference plane 1026 corresponds with the reference plane coincident with the outer flat portion of the contoured faceplate 1008, as discussed in the previous paragraph. As discussed, either reference plane may serve as the reference plane used to determine the contour profile of the contoured faceplate 1008.

Figure 11A:
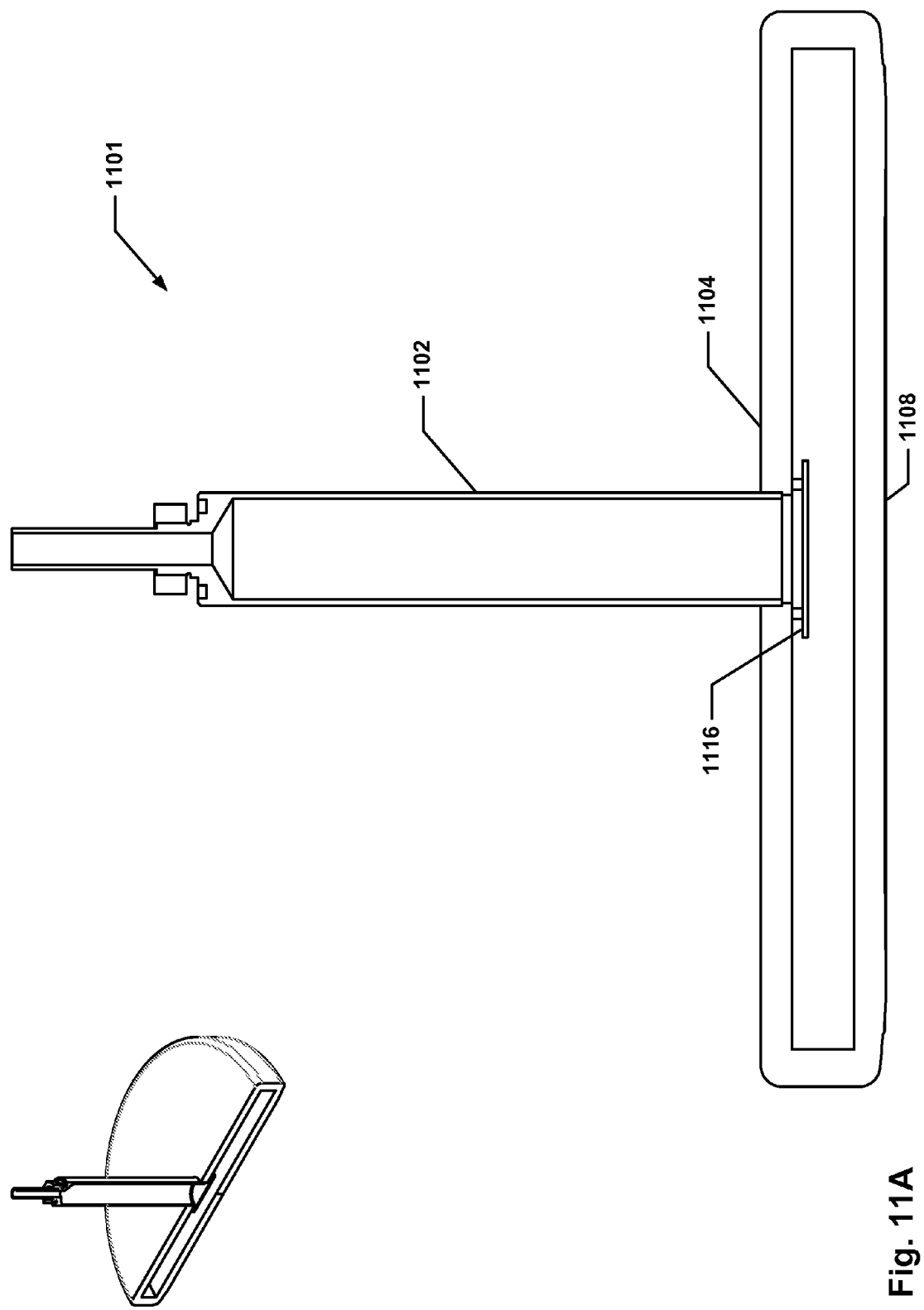
FIG. 11A depicts a cross-sectional side view of an example of another contoured showerhead.
Figure 11B:
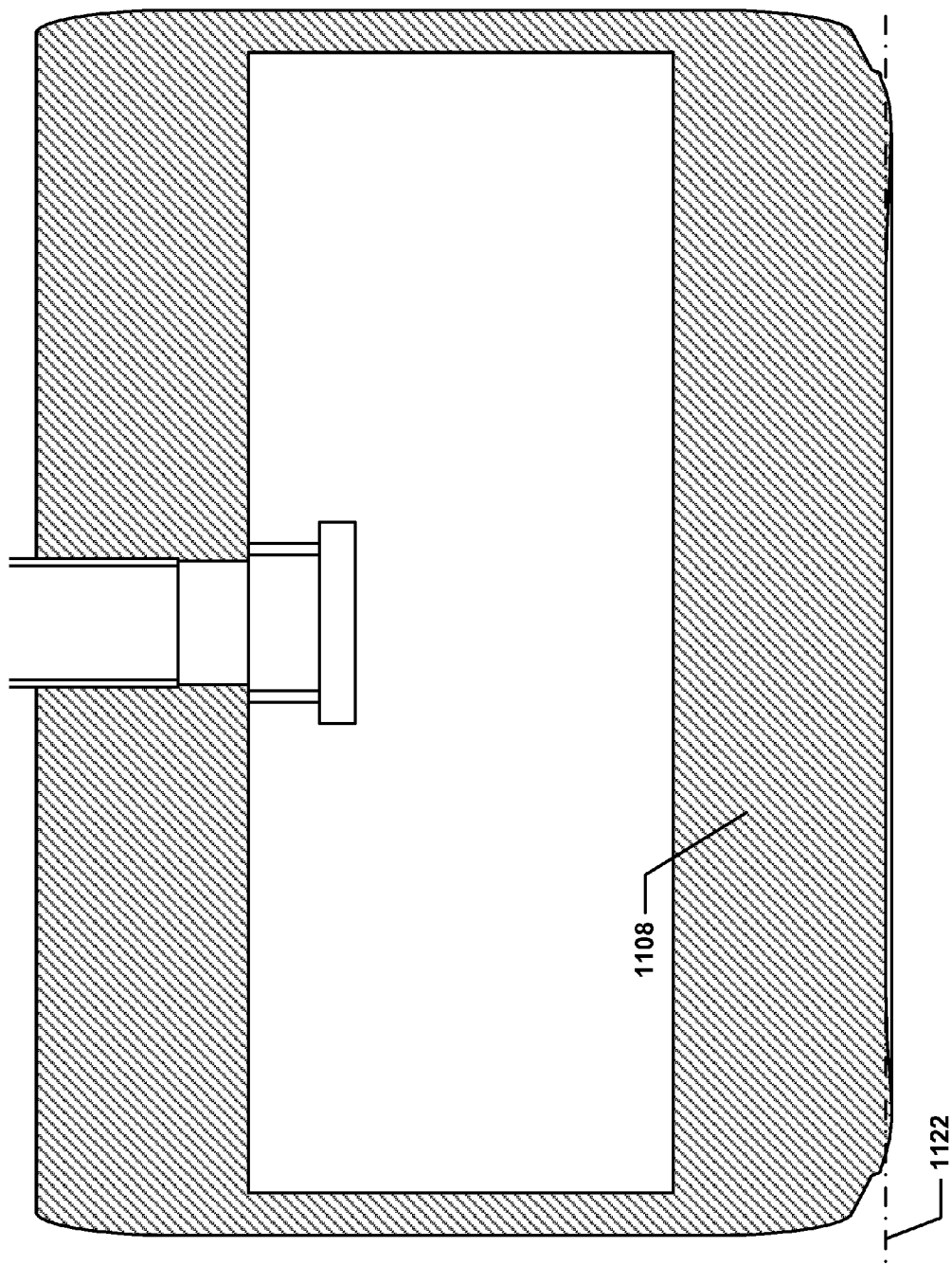
FIG. 11B depicts the cross-sectional side view of the example showerhead of FIG. 11 but scaled by 600% along one axis.

FIG. 11A depicts a cross-sectional side view of an example of another contoured showerhead. In this example, the contour is somewhat similar to the contour shown in FIGS. 9A-9C. FIG. 11B depicts the cross-sectional side view of the example showerhead of FIG. 11A but scaled by 600% along one axis. As can be seen, the contour, even at this scaling, is very subtle.

Figure 12A:
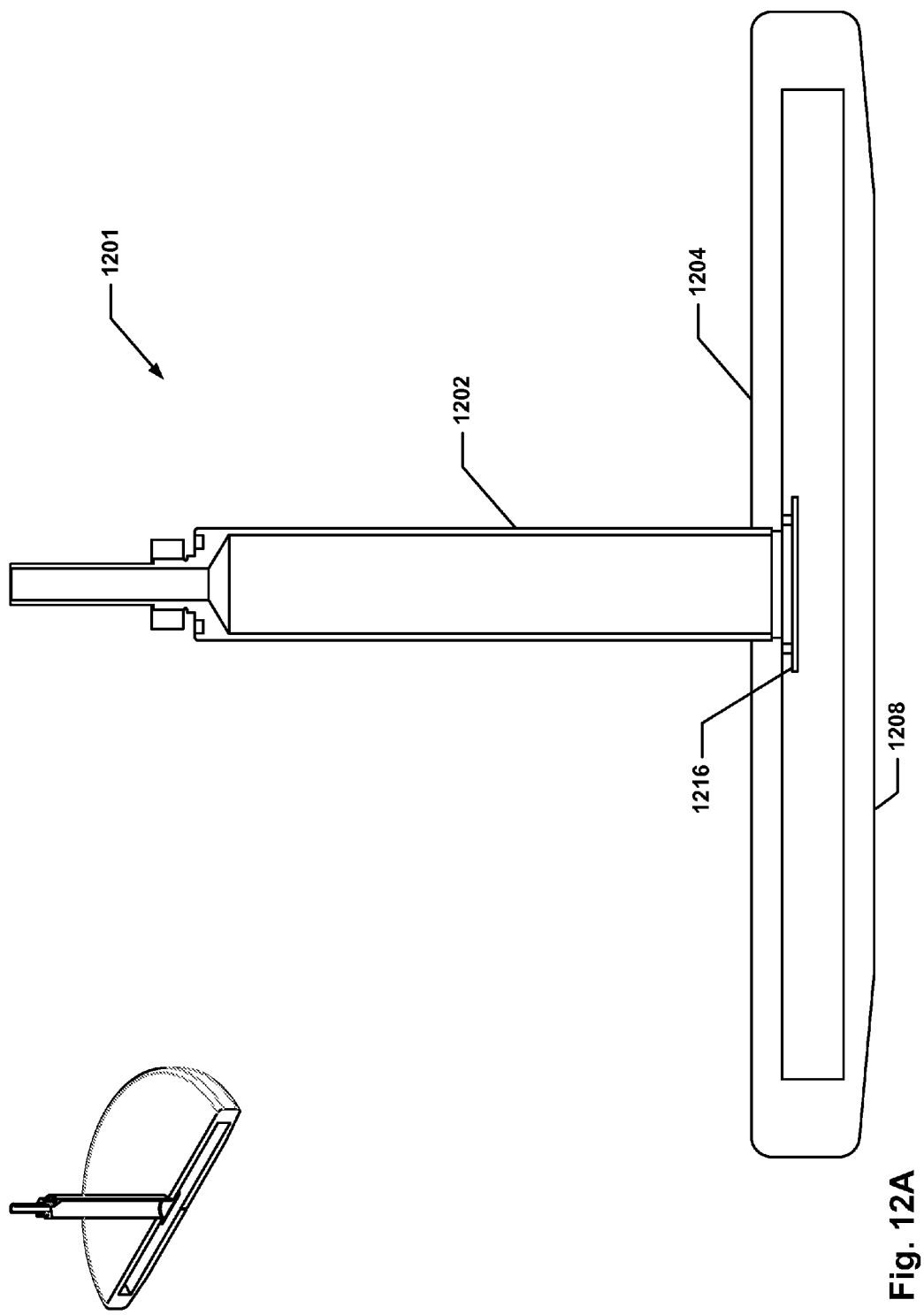
FIG. 12A depicts a cross-sectional side view of an example of another contoured showerhead.
Figure 12B:
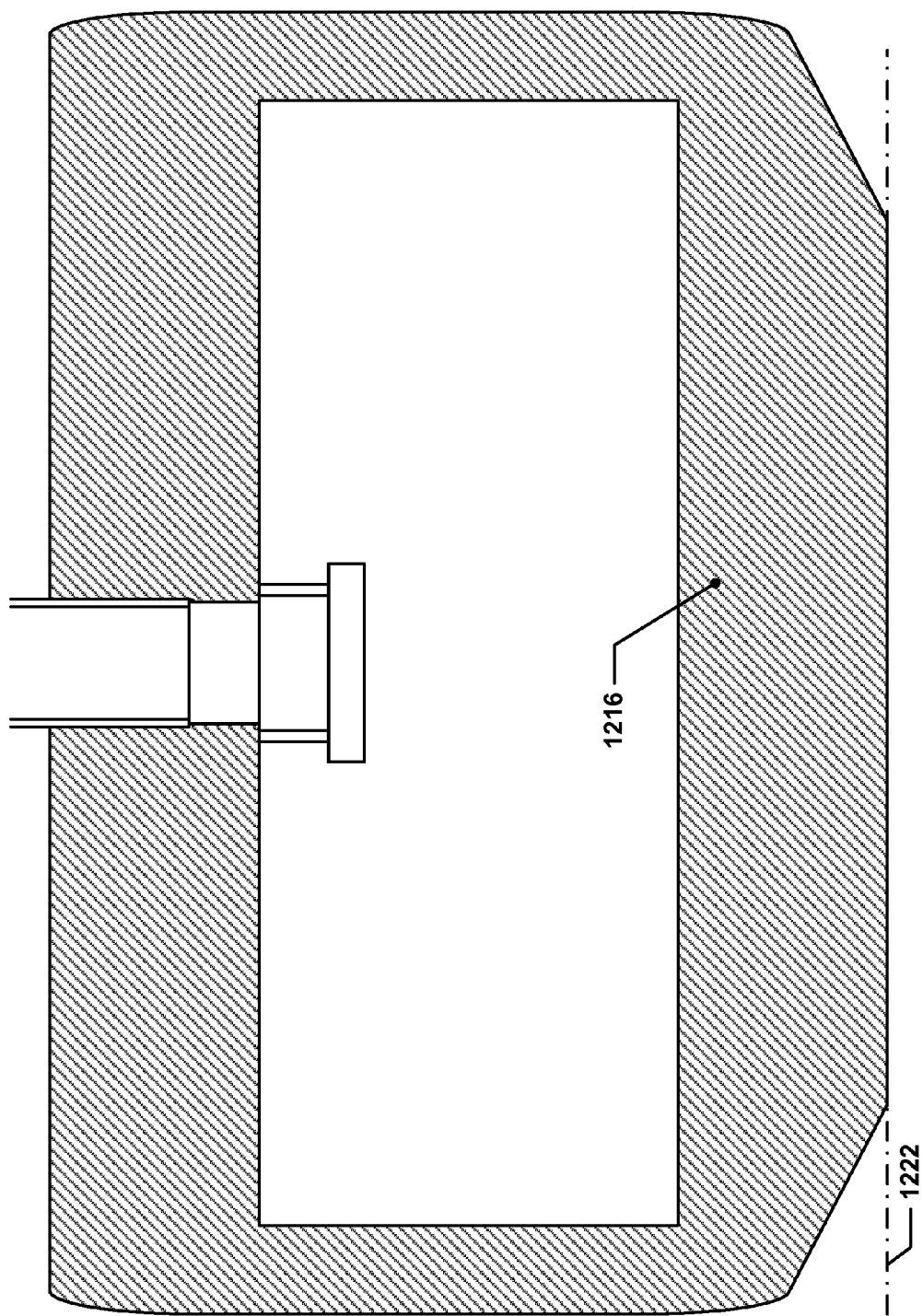
FIG. 12B depicts the cross-sectional side view of the example showerhead of FIG. 12 but scaled by 600% along one axis.

FIG. 12A depicts a cross-sectional side view of an example of another contoured showerhead. In this case, the contouring consists solely of a pronounced edge chamfer and is clearly visible even in FIG. 12A. FIG. 12B depicts the cross-sectional side view of the example showerhead of FIG. 12A but scaled by 600% along one axis.

As can be seen from the example contoured showerheads depicted in the accompanying figures, there is considerable variation possible in contoured showerheads produced according to the techniques and concepts outlined herein. The details of any particular design associated with a given semiconductor fabrication process may be governed by the particular deposition v. gap distance behavior observed during performance of the fabrication process using a reference showerhead/reference substrate, and by the observed deposition layer thicknesses observed across the reference substrate at a particular gap distance.

Figure 13:
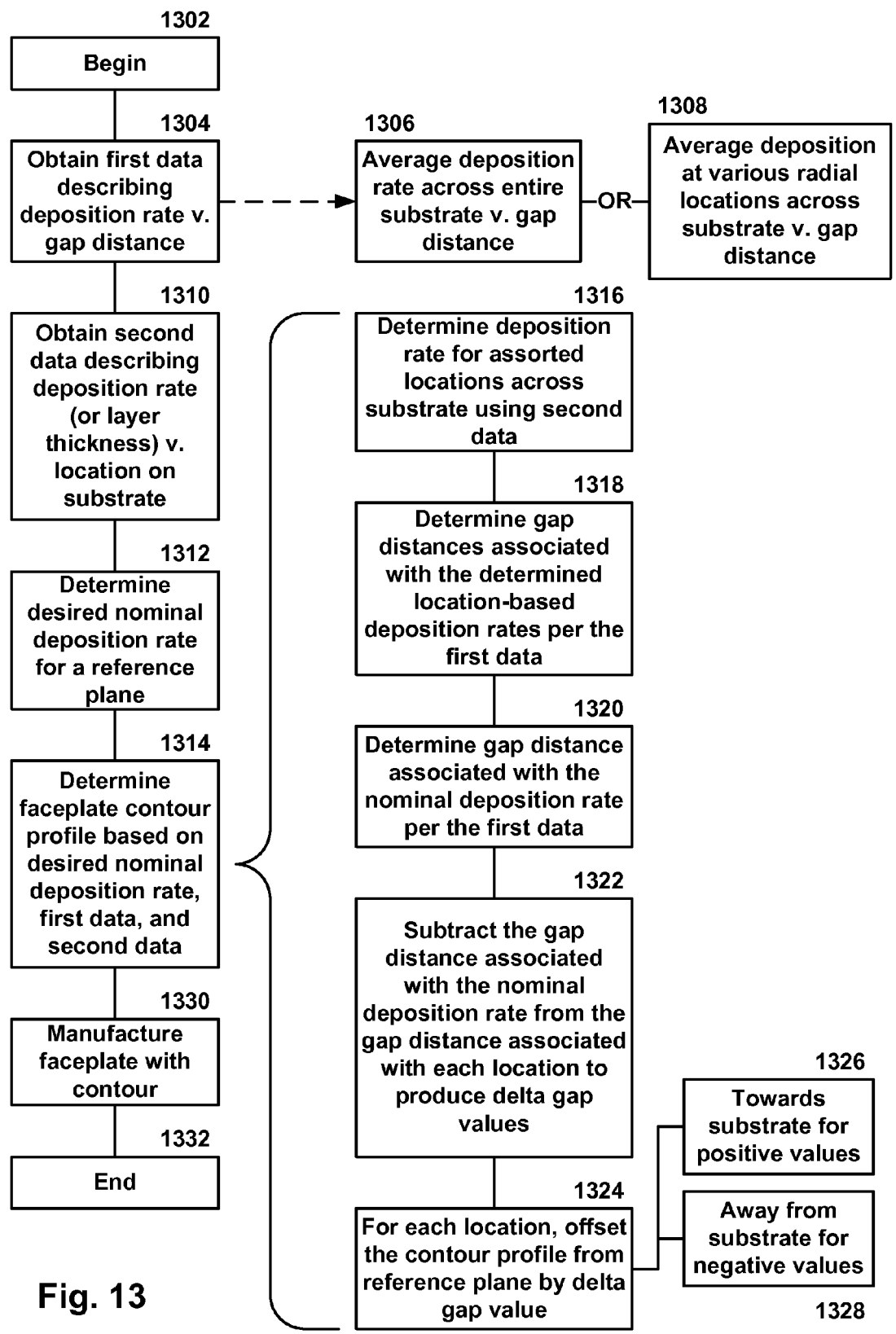
FIG. 13 provides a flow chart of one technique for determining a showerhead faceplate contour profile.

FIG. 13 provides a flow chart of one technique for determining a showerhead faceplate contour profile according to the concepts outlined herein. The technique begins in block 1302. In block 1304, first data, e.g., the first dataset, is obtained describing deposition rate on a reference semiconductor substrate v. gap distance between the reference semiconductor substrate and a reference showerhead faceplate.

There are several potential sources of such first data. For example, one possible source of such first data is identified in block 1306: the average deposition rate across the entire substrate as a function of gap distance. Such an average may be based on results observed with a single reference substrate or on the averaged results from several reference substrates. Such first data may be used to determine a gap distance that is correlated with a given deposition rate.

Figure 14:
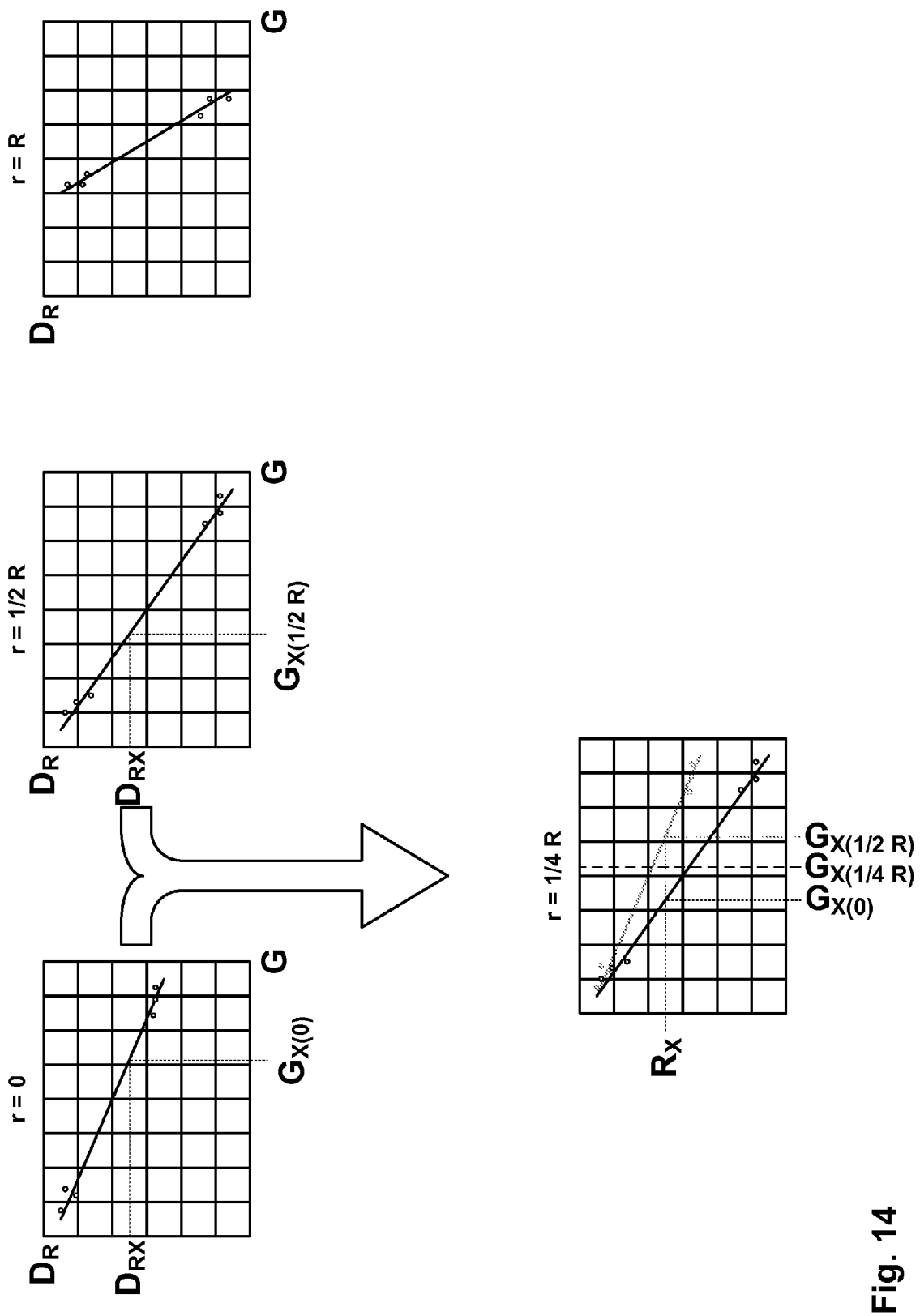
FIG. 14 depicts an example of interpolating between multiple datasets.

Another potential source for such first data is identified in block 1308: the average deposition rates as a function of gap distance for a reference showerhead at several locations across a substrate. For example, consider FIG. 14, which depicts plots of three data subsets of deposition rate as a function of gap distance, each associated with a different radial location. In this example, one data subset corresponds with the average deposition rate as a function of gap distance at the center of the substrate/showerhead (r=0). A second data subset corresponds with the average deposition rate as a function of gap distance at the mid-diameter of the substrate/showerhead (r=½ R, where R is the outer radius of the substrate), and a third data subset corresponds with the average deposition rate as a function of gap distance at the periphery of the substrate (r=R). As can be seen, the data points collected in each data subset, when fit with a linear curve fit, produce lines with different slopes, indicating that the deposition rate v. gap distance relationship at each of the three locations is different. Such first data may be used to determine a gap distance that is correlated with a given deposition rate and a particular radial location.

For example, if one desires to determine the gap distance associated with a particular deposition rate at the center of the reference substrate with respect to the first dataset in the above scenario, the first data subset may be used. Similarly, if one desires to determine the gap distance associated with the particular deposition rate at the mid-diameter of the reference substrate with respect to the first dataset in the above scenario, the second data subset may be used. However, if one wishes to determine the gap distance associated with the particular deposition rate at, for example, a location at approximately 25% of the radius of the substrate, it may be necessary to interpolate between the first data subset and the second data subset.

In block 1310, second data may be obtained that describes the deposition layer thickness/deposition rate v. location on a reference substrate for the reference showerhead (with the reference showerhead held in a fixed position with respect to the reference substrate). Based on the second data, regions of the showerhead may be selected for contouring, e.g., regions of the showerhead with high levels of non-uniformity as indicated in the second dataset.

In block 1312, a desired nominal deposition rate may be selected. A reference plane may be associated with the nominal deposition rate; the reference plane may be parallel to the substrate and be offset from the substrate by a gap distance corresponding to the gap distance in the first data that is associated with the deposition rate in the first data that correlates with the nominal deposition rate. The nominal deposition rate may be the target deposition rate for the process in question. In some implementations, the gap distance associated with the nominal deposition rate may also be the gap distance used in collecting the second data.

In block 1314, a contour profile may be determined for a faceplate based on the desired nominal deposition rate/deposition layer thickness, the data in the first dataset, and the data in the second dataset. One potential technique for determining such a contour profile is outlined in blocks 1316 through 1328, although other techniques may be used as well.

In block 1316, deposition rates for various locations across the substrate may be determined based on the second dataset. If the second dataset is expressed in terms of layer thickness, this data may first be transformed into deposition rate data (alternatively, one may convert each dataset to use deposition layer thickness rather than deposition rate). The locations may correspond to contour points, i.e., locations across a reference plane from which a contour offset will be determined. The selection of contour points and the reference plane are discussed previously in this paper.

In block 1318, gap distances associated with each of the locations/contour points may be determined by correlating the deposition rate/deposition layer thickness data for each contour point from the second dataset with a gap distance associated with a corresponding deposition rate/deposition layer thickness from the first dataset. If the first data set used is structured as described with reference to block 1308, the location of the contour point may also be used to determine the data from the first dataset that will be used to determine the gap distance.

In block 1320, the gap distance associated with the nominal deposition rate may be determined by correlating the nominal deposition rate/deposition layer thickness data with the gap distance associated with a corresponding deposition rate/deposition layer thickness from the first dataset.

In block 1322, the gap distance from the first dataset associated with the nominal deposition rate may be subtracted from the gap distance from the first dataset associated with each of the locations/contour points to produce a delta gap value associated with each contour point.

In block 1324, the contour profile may, at each contour point location, be offset from the reference plane by the delta gap value associated with that contour point. As noted in blocks 1326 and 1328, positive delta gap values may be offset towards the substrate, and negative delta gap values may be offset away from the substrate. Of course, these directions depend on the original frame of reference adopted, and may, in some implementations, be reversed if the coordinate frames used are reversed.

As noted, other techniques for determining the contour offset may be used as well, e.g., multiplying the nominal/contour-point deposition rate delta by the slope of a line fit to the first dataset data, as described more fully previously. Thus, the specific procedure used to perform block 914 may differ from that shown in blocks 1316-1328.

In block 1330, a faceplate may be manufactured using the contour profile determined in block 1314. For example, the reference plane may be defined in a 3D model of the faceplate, and a contour drawn through points corresponding to the offsets from the contour points along the reference plane. The contour may be used to form a revolved feature on the faceplate that defines the bottom face, i.e., the contoured face, of the faceplate. The resulting solid model, after sufficient additional features have been added, may be used in a computer-controlled machining process that re-creates the defined contour profile in a physical part. In block 1332, the process may be completed and the faceplate installed on a showerhead or in a semiconductor processing tool.

It is to be understood that the above-described processes may be used to define showerhead faceplate geometries that may be implemented on showerheads with a variety of different materials. For example, an aluminum faceplate blank may be machined using the showerhead faceplate contour profile generated using the techniques outlined above. Alternatively, a ceramic, e.g., $Al_2O_3$, faceplate may be sintered using a mold featuring the contoured surface. Other techniques may be used as well as appropriate.

While the examples herein have been discussed largely in the context of an axially symmetric contour profile (with respect to the center axis of the faceplate/substrate) and, consequently, uniaxial datasets, e.g., deposition rate or layer thickness as a function of radius, the technique may be adapted for other scenarios as well. For example, in some manufacturing processes, substrates may exhibit pattern-loading effects. Pattern loading effects occur when the lithographic patterning on a substrate results in concentrations of metallic materials in the substrate that affect the electromagnetic environment above the substrate and, consequently, the deposition rate in the vicinity of the patterns in question. Thus, deposition layer thickness non-uniformity in such situations may be a function of radial position and angular position or, alternatively, based on X-Y coordinate pairs (assuming X and Y axes are parallel to the substrate).

In such implementations, the contour developed may be quite complex and may not be axially symmetric. As a result, a much larger number of contour points may need to be identified and offsets determined in order to produce a useful contoured faceplate. The fundamental technique, however, would remain largely the same.

It is to be understood that, as mentioned above, classic flat-faceplate showerhead may include some features that could be viewed as deviating from a "flat" faceplate. For example, the rounding or other edge treatment of the outer edge of the showerhead faceplate introduces a non-planar surface at the peripheral edge of the faceplate. Such edge-region deviations from a planar surface should be understood to fall outside of the contoured regions of the showerheads discussed herein. While it may be difficult to discern where an edge region begins (depending on the particular edge treatment), the edge region associated with a rounded edge feature might extend in from the edge by a distance substantially equal to the round radius. In many showerheads, the "edge region" may be defined as being an annular region of the faceplate bounded by the faceplate outer diameter and a diameter larger than the outer diameter of the substrate with which the faceplate is designed to be used. Thus, the contoured regions of faceplates according to the techniques outlined herein may generally be in areas of the faceplate that correspond with regions of the substrate.

Other features that may cause departures from a planar surface are the through-holes that deliver gas through the faceplate. These holes may sometimes be chamfered or possess other edge treatments where they exit the faceplate. Such chamfered surfaces should also not be viewed as representing a "contoured" surface as described herein.

As is evident from the above discussion, showerhead faceplates produced according to the techniques discussed herein may exhibit several marked feature differences as compared to the traditional, flat showerhead faceplate. First, the contoured showerhead faceplates may not, overall, have a flat profile across the span of the faceplate. Second, contoured showerhead faceplates may have contoured surfaces defined according to the techniques outlined herein that exist in regions of the faceplate other than the edge region of the faceplate. Third, contoured showerhead faceplates may produce a much lower degree of non-uniformity in deposition layers produced using the contoured showerhead.

Testing of this concept with various processes seems to suggest that processes with smaller typical gap distances, e.g., less than about 0.4 inches, are more sensitive to contouring than processes with larger typical gap distances, e.g., larger than about 0.5 inches. This result indicates that the level of modulation versus baseline simply scales with the level of showerhead contour profile exaggeration.

In some implementations, the techniques described herein may be implemented using a specially-programmed computing device, e.g., via software instructions stored on/in a machine readable medium, e.g., on a hard disk, memory device, CD or DVD, network storage system, etc. Such instructions may be executable by one or more processors of the computing device and may be used to generate contour profiles for showerhead faceplates as detailed above. The output of such software may, for example, be provided to a computer numeric-controlled (CNC) manufacturing device, e.g., a CNC lathe, mill, or other device, to facilitate manufacture of a contoured showerhead faceplate.

The contoured showerhead faceplates described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a substrate stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper. Further, the disclosed contoured showerheads may be implemented in a process with lithography and/or patterning processes preceding or following the disclosed methods.

In some implementations, the contoured showerhead may be installed in a reactor and linked to a system controller having instructions for controlling process operations. The system controller will typically include one or more memory devices and one or more processors configured to execute the instructions so that the apparatus will perform various semiconductor fabrication processes. Machine-readable media containing instructions for controlling process operations may be coupled to the system controller. The processors may include a CPU or computer and may include or be communicatively connected with one or more analog and/or digital input/output connections, stepper motor controller boards, etc. The system controller, for example, may be configured to control gas delivery to the showerhead, pedestal movement, vacuum port suction to evacuate gas from the reactor, power and frequency to the plasma electrodes, and/or heating and cooling elements, if present in a particular implementation.

Typically there will be a user interface associated with the system controller. The user interface may include a display screen, graphical software displays of the apparatus and/or process conditions, and user input devices such as pointing devices, keyboards, touch screens, microphones, etc. The system controller may be connected to any or all of the components shown in of a tool or module, including those shown in the Figures of this application; the system controller's placement and connectivity may vary based on the particular implementation.

In certain implementations, the system controller controls the pressure in various processing chambers in a tool. The system controller may also control the concentration of various process gases in the chamber by regulating valves, liquid delivery controllers, and MFCs in the delivery system as well as flow restriction valves in an exhaust line. The system controller executes system control software including sets of instructions for controlling the timing, flow rates of gases and liquids, chamber pressure, chamber/showerhead/pedestal/substrate temperature, and/or other parameters of a particular process. Other computer programs stored on memory devices associated with the controller may be employed in some implementations. In certain implementations, the system controller controls the transfer of a substrate into and out of the various apparatuses shown in the figures.

The computer program code for controlling the processes in a process sequence can be written in any conventional computer readable programming language: for example, assembly language, C, C++, Pascal, Fortran or others. Compiled object code or script is executed by the processor to perform the tasks identified in the program. The system software may be designed or configured in many different ways. For example, various chamber component subroutines or control objects may be written to control operation of the chamber components necessary to carry out the described processes. Examples of programs or sections of programs for this purpose include process gas control code, pressure control code, and plasma control code.

The controller parameters relate to process conditions such as, for example, timing of each operation, pressure inside the chamber, substrate temperature, process gas flow rates, RF power, as well as others described above. These parameters are provided to the user in the form of a recipe, and may be entered utilizing the user interface. Signals for monitoring the process may be provided by analog and/or digital input connections of the system controller. The signals for controlling the process are output on the analog and digital output connections of the apparatus.

Although several implementations of this invention have been described in detail herein with reference to the accompanying drawings, it is to be understood that the invention is not limited to these precise implementations, and that various changes and modifications may be effected therein by one skilled in the art without departing from the scope of spirit of the invention as defined in the appended claims.

We claim:

1. A method comprising:
   obtaining first deposition rate data describing first deposition rates, each first deposition rate correlated with a gap distance between a reference showerhead faceplate and a reference substrate during performance of a semiconductor manufacturing process involving a capacitively-coupled plasma, wherein the gap distances correlated with at least two of the first deposition rates are different;
   obtaining second deposition rate data, the second deposition rate data describing second deposition rates when the reference showerhead faceplate is in a fixed configuration with respect to the reference substrate during the semiconductor manufacturing process involving the capacitively-coupled plasma, the second deposition rates associated with locations distributed across one or more portions of the reference showerhead faceplate during performance of the semiconductor manufacturing process; and
   determining a contour profile for a contoured showerhead faceplate based on the first deposition rate data and the second deposition rate data.

2. The method of claim 1, wherein the second deposition rate data comprises deposition layer thickness at the locations.

3. The method of claim 1, wherein determining the contour profile comprises:
   determining a nominal deposition rate;
   determining a reference plane for the contoured showerhead faceplate, the reference plane defined, when the contoured showerhead faceplate is used during the semiconductor manufacturing process, to be:
      substantially parallel to substrates being processed in the semiconductor manufacturing process, and
      offset from the substrates by the gap distance correlated with the first deposition rate corresponding to the nominal deposition rate;
   determining a gap distance delta for each of the locations by subtracting a first gap distance from a second gap distance, wherein:
      the first gap distance is correlated with the first deposition rate corresponding to the nominal deposition rate, and
      the second gap distance is correlated with the first deposition rate corresponding to the second deposition rate associated with the location; and
   establishing, for each location, a contour point offset from the reference plane by the gap distance delta determined for the location, wherein for positive gap distance deltas, the contour point is offset in a direction towards the substrates when the contoured showerhead faceplate is used in the semiconductor manufacturing process, and wherein for negative gap distance deltas, the contour point is offset in a direction away from the substrates when the contoured showerhead faceplate is used in the semiconductor manufacturing process.

4. The method of claim 3, further comprising manufacturing a contoured faceplate with an exterior surface defined by the contour profile.

5. The method of claim 4, further comprising manufacturing the contoured faceplate with an interior surface defined by a second contour profile offset from the contour profile in a direction normal to the reference plane.

6. The method of claim 3, wherein:
   the first deposition rates in the first deposition rate data are grouped into datasets, each dataset corresponding to a particular radial position from the center of the reference substrate, and
   each second gap distance is determined by interpolating between intermediary gap distances drawn from two or more of the datasets, wherein each intermediary gap distance is determined by interpolating between first deposition rates in the data set from which the intermediary gap distance is drawn.

7. The method of claim 3, wherein the gap distance correlated with the first deposition rate corresponding to the nominal deposition rate is determined by interpolating between data points in the first deposition rate data.

8. The method of claim 3, wherein the gap distance correlated with the first deposition rate corresponding to the second deposition rate associated with the location is determined by interpolating between data points in the first deposition rate data.

9. The method of claim 3, wherein the contour point offsets include both negative gap distance deltas and positive gap distance deltas.

10. The method of claim 3, wherein the contour profile deviates from the reference plane by an amount greater than a flatness tolerance zone of the reference showerhead faceplate.

11. The method of claim 3, wherein the contour profile deviates from the reference plane by an amount greater than 0.010" per 3".

12. The method of claim 1, wherein each first deposition rate is an average deposition rate.

13. The method of claim 12, wherein each first deposition rate is an average deposition rate across substantially all of the reference substrate.

14. The method of claim 1, wherein each location corresponds to a radial distance from a center axis passing through a center of the reference substrate and each second deposition rate is an average deposition rate at each radial distance.

15. The method of claim 1, wherein the reference showerhead faceplate is a flat faceplate.

16. The method of claim 1, wherein the one or more portions of the reference showerhead faceplate include an annular region of the reference showerhead faceplate.

17. The method of claim 16, wherein the contour profile is:
flat at radial distances from the center of the contoured faceplate less than the inner annular radius of the annular region, and
varies at radial distances from the center of the contoured faceplate greater than the inner annular radius of the annular region.

18. The method of claim 1, wherein the one or more portions of the reference showerhead faceplate include a region of substantially the same nominal size as the reference substrate.

19. The method of claim 1, wherein the one or more portions of the reference showerhead faceplate correspond with one or more areas of the reference substrate experiencing pattern loading effects.

20. A contoured showerhead faceplate with a contour profile determined according to the method of claim 1.

* * * * *